(12) United States Patent
Okayasu

(10) Patent No.: US 6,313,677 B1
(45) Date of Patent: Nov. 6, 2001

(54) SIGNAL TRANSMISSION CIRCUIT, CMOS SEMICONDUCTOR DEVICE, AND CIRCUIT BOARD

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/617,288

(22) Filed: Jul. 14, 2000

Related U.S. Application Data

(62) Division of application No. 09/137,163, filed on Aug. 20, 1998, now Pat. No. 6,166,575.

(30) Foreign Application Priority Data

Aug. 20, 1997 (JP) .................................................. 9-223425

(51) Int. Cl.[7] .................................................. H03K 5/12
(52) U.S. Cl. ............................. 327/170; 327/319; 326/30
(58) Field of Search ........................ 326/30, 31; 327/170, 327/306, 309, 317, 319, 333, 379

(56) References Cited

U.S. PATENT DOCUMENTS

| | | | |
|---|---|---|---|
| 4,450,370 | 5/1984 | Davis | 307/475 |
| 5,019,728 | 5/1991 | Sanwo et al. | 307/475 |
| 5,345,111 | 9/1994 | Fong . | |
| 5,384,808 | 1/1995 | Van Brunt et al. | 375/36 |
| 5,898,326 | 4/1999 | Okayasu | 327/112 |
| 5,905,399 | 5/1999 | Bosnyak et al. | 327/384 |
| 5,969,540 | 10/1999 | Hwang | 326/56 |
| 6,154,047 | * 11/2000 | Taguchi | 326/30 |

FOREIGN PATENT DOCUMENTS

| | | |
|---|---|---|
| 0318018 | 5/1989 | (EP) . |
| 0575124 | 12/1993 | (EP) . |
| 0655839 | 5/1995 | (EP) . |
| 2296592 | 7/1996 | (GB) . |
| 2317515 | 3/1998 | (GB) . |

* cited by examiner

*Primary Examiner*—Jeffrey Zweizig
(74) *Attorney, Agent, or Firm*—Rosenthal & Osha L.L.P.

(57) ABSTRACT

A signal transmission circuit, a CMOS semiconductor device, and a circuit board improve the signal transmission characteristic of a signal line having a large capacitance that is generated on the long signal line inside a large-scale integrated circuit when the signal line is long or when many driven circuits are connected to the signal line. The midpoint voltage of the power source voltage of the drive circuit and driven circuit is output. An assist-circuit having low output impedance is then connected to the signal line. The voltage of the signal line is thus held at the midpoint voltage of the power source voltage. At the same time, a drive signal that is output from the driver circuit is excited centered at the midpoint voltage (threshold voltage of the driven circuit) with a small amplitude. The driven circuit is then driven by this drive signal that is restricted to the small amplitude.

1 Claim, 19 Drawing Sheets

SIGNAL TRANSMISSION CIRCUIT, CMOS SEMICONDUCTOR DEVICE, AND CIRCUIT BOARD

This is a division of application Ser. No. 09/137,163, filed Aug. 20, 1998 now U.S. Pat. No. 6,166,575.

BACKGROUND OF THE INVENTION

1. Field of Invention

The present invention relates to a signal transmission circuit, a CMOS semiconductor device, and a circuit board, and more particularly, to a signal transmission circuit having an assist-circuit, a CMOS semiconductor device having an assist-circuit, and a circuit board having an assist-circuit.

2. Description of Related Art

As the size of a semiconductor integrated circuit device increases, the size of a semiconductor chip that forms the semiconductor integrated circuit device is also increased. As a result, the length of a signal wire that is formed inside the semiconductor chip (for example, a signal wire for distributing a clock, a signal wire that forms a bus line, or the like) tends to be long.

FIG. 1 shows the configuration of each type of signal wire formed inside an integrated circuit device. A large-scale integrated circuit device is formed inside a square semiconductor chip CP whose side length is approximately 15 mm through 20 mm. Therefore, it is not unusual that the wire length of a signal wire LIN formed inside an integrated circuit device reaches over 20 mm.

A shown in FIG. 1 shows a wiring configuration of a circuit in which the line length of a signal line LIN between a driver circuit DR and a driven circuit RC is less than 100 µm. B shows a wiring configuration of a circuit in which the line length exceeds 20 mm. C shows a wiring configuration of a circuit like a bus line or a clock distribution line in which multiple driven circuits RC are connected to a signal line LIN.

Wiring capacitance CL is generated on a signal line LIN that connects between a driver circuit DR and a driven circuit RC. Input capacitance CG is formed at the input terminal of the driven circuit RC. The values of the wiring capacitance CL in A, B, and C differ from each other, and the values of the input capacitance CG in A, B, and C differ from each other. The value of the input capacitance CG is proportional to the number of driven circuits RC connected to the signal line LIN. The value of the wiring capacitance CL is proportional to the length of the signal line LIN.

Seeing the wiring configurations A, B, and C from this view point, the wiring configuration A, when it is connected to the signal line LIN, has the smallest capacitance value. Subsequently, the capacitance value of the wiring configuration B is larger than that of the wiring configuration A, and the capacitance value of the wiring configuration C is larger than that of the wiring configuration B. Depending on the value of this capacitance, the transmission characteristic of a signal differs greatly.

FIG. 3 shows the wave-forms of step response waves that are generated when a step pulse is supplied to each of these wiring configurations A, B, and C. FIG. 3A shows the wave-form of a step response wave that is generated by the wiring configuration A shown in FIG. 1. FIG. 3B shows the wave-form of a step response wave that is generated by the wiring configuration B shown in FIG. 1. FIG. 3C shows the wave-form of a step response wave that is generated by the wiring configuration C shown in FIG. 1. As is evident from FIG. 3, at the wire length of the wiring configuration A shown in FIG. 1, virtually no delay is visible in the rise of the step wave-form. However, in the wiring configurations B and C, the shapes of the step waves are greatly rounded, generating long response delays. In particular, this tendency appears prominently in the wiring configuration C having a long signal line LIN to which many driven circuits RC are connected.

FIG. 4 shows the wave-forms of response waves. The wiring configuration A transmits an input pulse to the driven circuit RC almost normally. However, the wiring configurations B and C hardly transmit the pulse to their driven circuits RC, respectively. In other words, it can be seen that a signal line having a large capacitive cannot transmit a pulse having a narrow pulse width. This is a main factor inhibiting development of a large-scale semiconductor chip.

The content of this factor also applies as a similar phenomenon to a signal line that connects between integrated circuit devices packaged on a circuit board (printed wiring board).

It should be noted that, in order to increase the degree of integration of a semiconductor integrated circuit device, the processing dimensions of a device such as a transistor need to be fined, and the widths of the wires must be formed thin. In this respect, it can be considered that the value of the capacitance generated on the signal line will become small. However, when the wire width is formed thin, the thickness of the insulation layer is also formed thin at the same time. Consequently, the wiring capacitance CL of the signal line and the input capacitance CG of the driven circuit RC do not decrease by a large amount even if the formation area is decreased as a result of the increased degree of integration.

On the other hand, in order to solve this problem, for example, in a circuit in which a clock pulse is distributed to many circuit regions MAP as shown in FIG. 5, a large capacitance driver circuit $DR_1$, a medium capacitance driver circuit $DR_2$, and a small capacitance driver circuit $DR_3$ can be connected to the circuit, which is seemingly a feasible method. However, if driver circuits $DR_1$, $DR_2$, and $DR_3$ are connected to each signal line LIN, the number of circuits inside the integrated circuit increases. As a result, the amount of power consumption also increases. In addition, the number of circuits for a signal to pass through also increases. Therefore, the timing accuracy also deteriorates.

SUMMARY OF THE INVENTION

It is an object of the present invention to propose a signal transmission circuit that is capable of assuring a signal transmission even through a long signal line without increasing the degree of integration inside an integrated circuit.

It is also an object of the present invention to provide a signal transmission circuit, a CMOS semiconductor device, and a circuit board that are capable of solving the above-stated problems. The object of the present invention can be achieved by a combination of characteristics described in the independent claims of the present invention. The dependent claims of the present invention determine further advantageous embodiments of the present invention. This invention proposes a signal transmission circuit having a configuration in which an assist-circuit, which has a low output impedance and outputs the mid point voltage of a power source voltage, is connected to a position on a signal line of the signal transmission circuit.

According to a signal transmission circuit based on this invention, an assist-circuit, which has a low output impedance and outputs the midpoint voltage of the power source voltage, is connected to a position on a signal line having a large wiring capacitance or a large input capacitance. As a result, the voltage of the signal line is driven centered at the mid point voltage of the power source voltage. In other words, the driven circuit is driven centered at its own threshold voltage.

Since the output impedance of the assist-circuit is low, the amplitude of the signal is kept small. However, since the driven circuit is driven centered at its own threshold value, the driven circuit is turned on and off assuredly, and is able to receive the signal even if the amplitude of the given signal is small. Moreover, since the output impedance of the assist-circuit is low, the time constant (in this case, it is the product of the resistance and capacitance) that determines the transition time of the transmission signal becomes small. As a result, the signal can be passed through the signal transmission circuit at a high speed.

Therefore, an input pulse can be transmitted through a signal line without distorting the wave-form of the input pulse even if the sum of the wiring capacitance and input capacitance is large.

Moreover, since the amplitude of the transmission signal becomes small, the amount of transitional charge-discharge currents that are supplied to the wiring capacitance and input capacitance are reduced. As a result, the amount of power consumed during an operation is also reduced.

In order to solve the above-stated problems, according to the first aspect of the present invention, a signal transmission circuit having a driver circuit for sending out a transmission signal, a signal line for propagating the transmission signal, and a driven circuit, which is driven by two power source voltages $V_{SS}$ and $V_{DD}$ ($V_{DD} > V_{SS}$), for taking in the transmission signal that is propagated through the signal line is provided. This signal transmission circuit has an assist-circuit for outputting a prescribed voltage, which is larger than the power source voltage $V_{SS}$ and smaller than the power source voltage $V_{DD}$, to the signal line.

According to the second aspect of the present invention, a signal transmission circuit as described in the first aspect of the present invention is provided such that the driven circuit has a digital circuit which outputs one of two values of a binary output voltage in response to a voltage input to the driven circuit, and the assist-circuit outputs a voltage that approximately matches a threshold voltage at which an output of the digital circuit is inverted from one of the two values of the binary output voltage to the other of the two values of the binary output voltage.

According to the third aspect of the present invention, a signal transmission circuit as described in the second aspect of the present invention is provided such that the assist-circuit outputs a voltage that is approximately a midpoint voltage of the power source voltages $V_{SS}$ and $V_{DD}$.

According to the fourth aspect of the present invention, a signal transmission circuit as described in the first aspect of the present invention is provided such that the assist-circuit has an output impedance that is lower than an output impedance of the driver circuit.

According to the fifth aspect of the present invention, a signal transmission circuit as described in the fourth aspect of the present invention is provided such that the output impedance of assist-circuit is ¼ through ½ of the output impedance of the driver circuit.

According to the sixth aspect of the present invention, a signal transmission circuit as described in the first aspect of the present invention is provided such that the assist-circuit has a first inverter including an input terminal and an output terminal, and a feedback circuit in which the input terminal of the first inverter is connected with the output terminal of the first inverter.

According to the seventh aspect of the present invention, a signal transmission circuit as described in the sixth aspect of the present invention is provided such that the driven circuit has a second inverter such that a beta ratio of the second inverter is approximately equal to a beta ratio of the first inverter.

According to the eighth aspect of the present invention, a signal transmission circuit as described in the first aspect of the present invention is provided such that the assist-circuit has a P-type FET and an N-type FET such that a forward bias voltage is applied to gates of the P-type FET and N-type FET, respectively.

According to the ninth aspect of the present invention, a signal transmission circuit as described in the first aspect of the present invention is provided such that the assist-circuit has a voltage source which outputs a prescribed voltage that is larger than the power source voltage $V_{SS}$ and smaller than the power source voltage $V_{DD}$.

According to the tenth aspect of the present invention, a signal transmission circuit as described in the ninth aspect of the present invention is provided such that the assist-circuit further has a low impedance buffer circuit which lowers an output impedance of the voltage that the voltage source has output.

According to the eleventh aspect of the present invention, a signal transmission circuit as described in any of the first through tenth aspects of the present invention is provided such that the signal transmission circuit further has a cut-off means which cuts off a current that flows between the signal line and the assist-circuit.

According to the twelfth aspect of the present invention, a signal transmission circuit as described in the first aspect of the present invention is provided such that the assist-circuit has an NAND gate and a feedback circuit in which an input terminal of the NAND gate is connected with an output terminal of the NAND gate.

According to the thirteenth aspect of the present invention, a signal transmission circuit as described in the twelfth aspect of the present invention is provided such that the NAND gate includes a control terminal to which a control signal, which cuts off a current that flows between the signal line and the assist-circuit, is input.

According to the fourteenth aspect of the present invention, a signal transmission circuit as described in the first aspect of the present invention is provided such that the assist-circuit has an NOR gate and a feedback circuit in which an input terminal of the NOR gate is connected with an output terminal of the NOR gate.

According to the fifteenth aspect of the present invention, a signal transmission circuit as described in the fourteenth aspect of the present invention is provided such that the NOR gate includes a control terminal to which a control signal, which cuts off a current that flows between the signal line and the assist-circuit, is input.

According to the sixteenth aspect of the present invention, a signal transmission circuit as described in the first aspect of the present invention is provided such that the assist-circuit is connected to a termination of the signal line.

According to the seventeenth aspect of the present invention, a CMOS semiconductor device having a signal transmission circuit that has a driver circuit for sending out a transmission signal, a signal line for propagating the transmission signal, and a driven circuit, which is driven by two power source voltages $V_{SS}$ and $V_{DD}$ ($V_{DD}>V_{SS}$), for taking in the transmission signal that has been transmitted through the signal line is provides such that the signal transmission circuit has an assist-circuit which outputs a prescribed voltage, which is larger than the power source voltage $V_{SS}$ and smaller than the power source voltage $V_{DD}$, to the signal line.

According to the eighteenth aspect of the present invention, a CMOS semiconductor device as described in the seventeenth aspect of the present invention is provided such that the assist-circuit has an output impedance that is lower than an output impedance of the driver circuit.

According to the nineteenth aspect of the present invention, a CMOS semiconductor device as described in the seventeenth aspect of the present invention is provided such that the assist-circuit has a beta ratio that is approximately equal to a beta ratio of the driven circuit.

According to the 20th aspect of the present invention, a circuit board having a first semiconductor device that has a driver circuit for sending out a transmission signal, a second semiconductor device, which is driven by two power source voltages $V_{SS}$ and $V_{DD}$ ($V_{DD}>V_{SS}$), having a driven circuit for taking in the transmission signal, and a signal line pattern for propagating the transmission signal from the driver circuit to the driven circuit, is provided. This circuit board has an assist-circuit which outputs a prescribed voltage, which is larger than the power source voltage $V_{SS}$ and larger than the power source voltage $V_{DD}$, to the signal line.

According to the 21st aspect of the present invention, a circuit board as described in the 20th aspect of the present invention is provided such that the assist-circuit has an output impedance that is lower than an output impedance of the driver circuit.

The outline of the above-described invention does not list all the required characteristics of the present invention. Sub-combinations of these characteristics group are also covered by the scope of the present invention.

DETAILED DESCRIPTION OF THE INVENTION

The present invention will be explained through its embodiments. However, the following embodiments do not limit the scope of the present invention described in the claims. Moreover, not all the combinations of the characteristics described in the embodiments are necessarily essential for solving the present invention.

Figure 6:
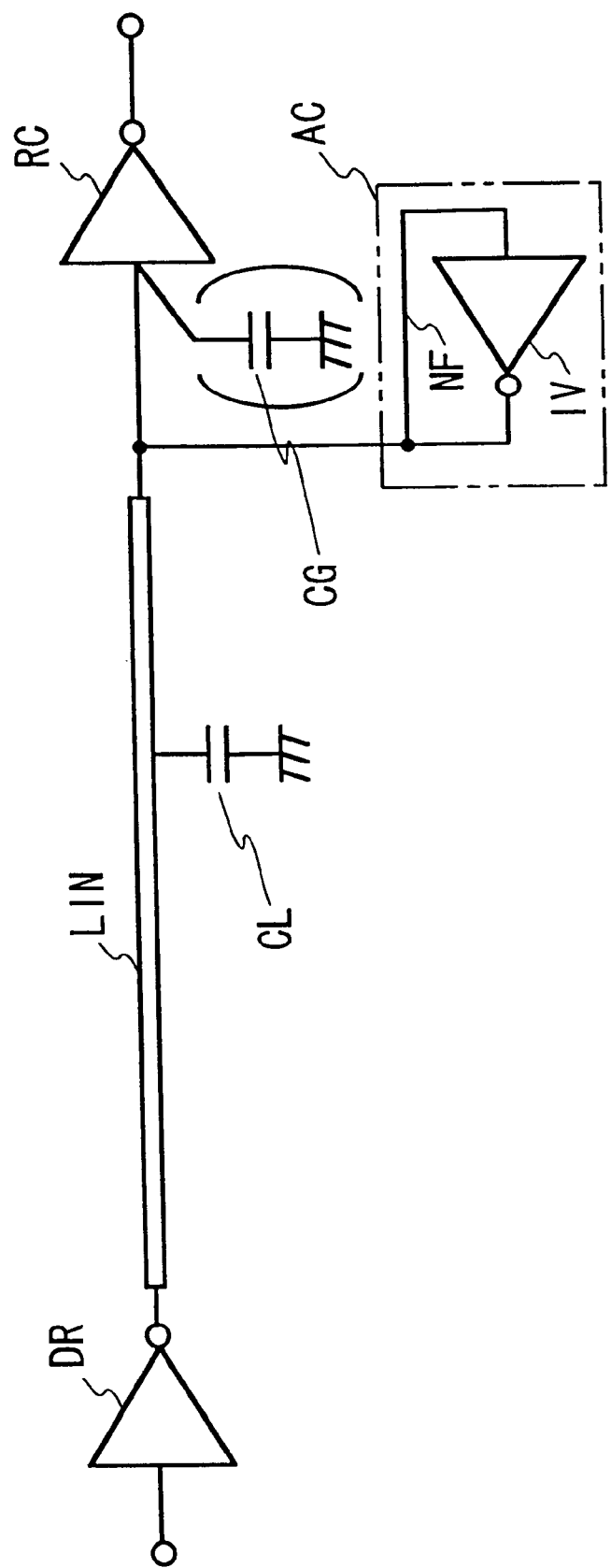
FIG. 6 is a block diagram for explaining the outline of this invention.

FIG. 6 shows an embodiment of a signal transmission circuit according to this invention. In FIG. 6, DR, RC, LIN, CL, and CG refer to a driver circuit, a driven circuit, a signal line, wiring capacitance, and an input capacitance, respectively, as has been explained with reference to the drawings.

In this invention, an assist-circuit AC is connected to a position on a signal line LIN. The assist-circuit AC can be constructed, for example, by connecting a total feedback circuit NF to an inverter INV (polarity inversion circuit) made of a CMOS circuit.

In transmitting a signal at a high speed, the signal that propagates through the signal line can be reflected by the driven circuit. In this case, an over-shoot or under-shoot can be generated in the wave-form of the reflected signal when the driven circuit receives the signal. In order to decrease the magnitude of such an over-shoot or under-shoot, the assist-circuit AC may be connected to the termination of the signal line LIN.

Figure 7:
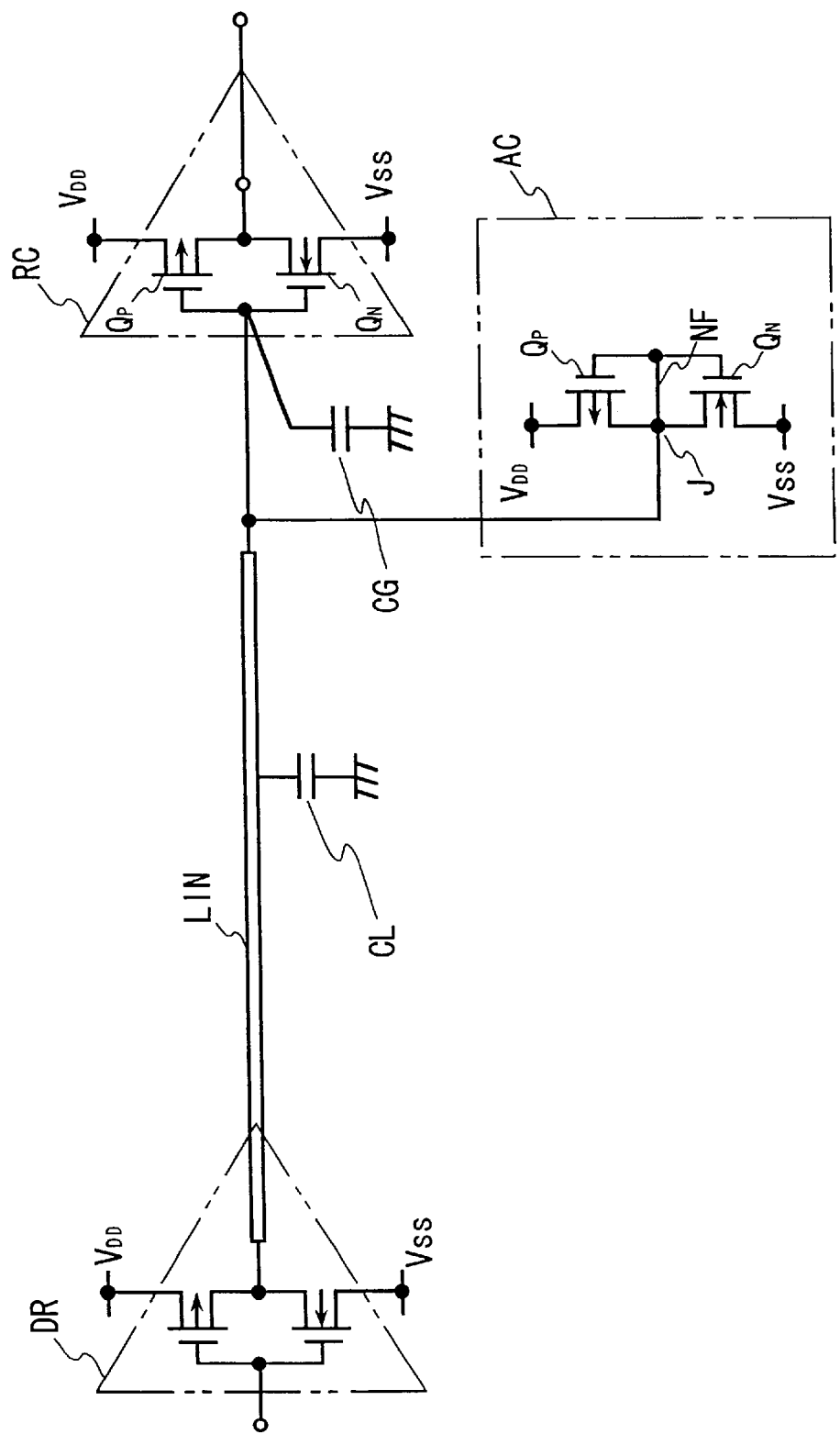
FIG. 7 is a connection diagram which specifically shows each part of the block diagram shown in FIG. 6.

FIG. 7 shows an example of its specific circuit structure. In this example, both the driver circuit DR and driven circuit RC contain an inverter made of a CMOS circuit. The assist-circuit AC can also be constructed by connecting the total feedback circuit NF to an inverter having a CMOS circuit structure. According to the circuit structure of this assist-circuit AC, the voltage at the common node J of the input and output terminals of the inverter can be stabilized approximately at the midpoint voltage of the power source voltage $V_{DD}$-$V_{SS}$. The reason for this will be explained with reference to FIG. 8.

Figure 8:
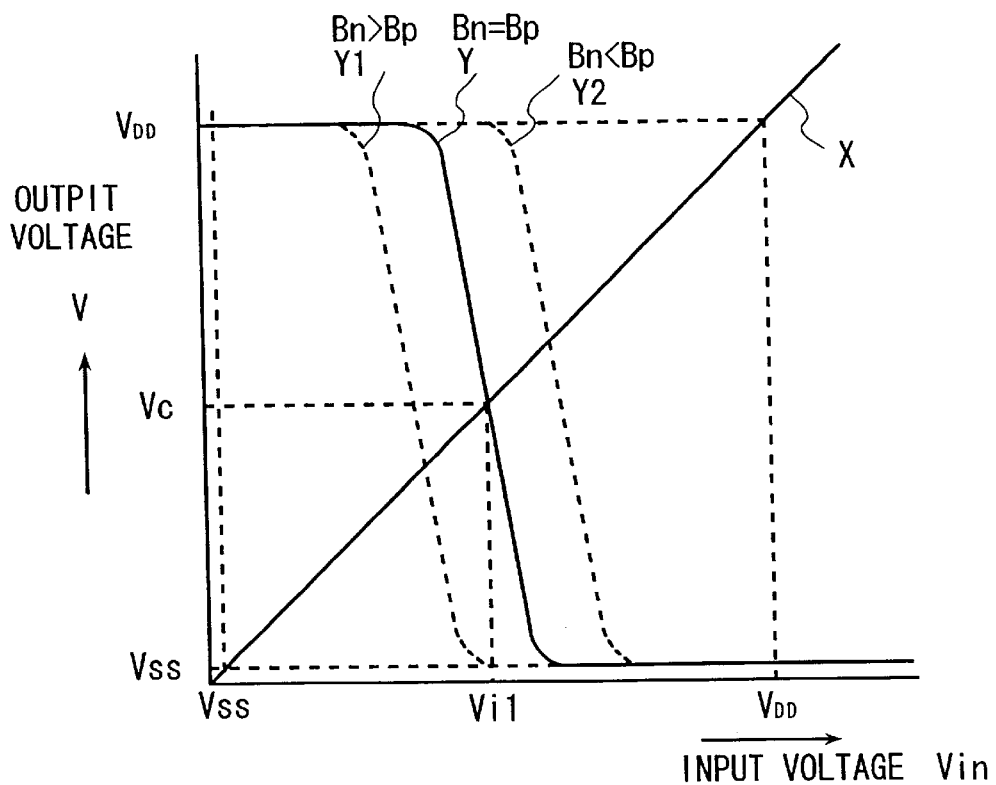
FIG. 8 is a graph for explaining the operation of the embodiment shown in FIG. 7.

In FIG. 8, the curve Y represents the direct current transmission characteristic (the relation between the output voltage and the input voltage) of the inverter IV.

Since the inverter has a logic inversion function (negation), the inverter exhibits a decaying characteristic in the neighborhood of the logic threshold value.

Here, if a total feedback is applied by shorting the input terminal with the output terminal (or by connecting the input terminal to the output terminal using a device like a resistor) in order to construct an assist-circuit AC according to the present invention, the value of the input voltage becomes equal to the value of the output voltage. Hence, if a straight line X given by Vin=Vout is drawn over the curve Y, it becomes clear that the output voltage of this circuit is equal to the Y-coordinate of the point at which the straight line X intersects the curve Y.

This intersection point is the point at which the output voltage is inverted on the curve that indicates the direct current transmission characteristic. In other words, the Y-coordinate of this intersection is equal to the logic threshold value of the inverter.

In the case in which the on-resistance of the P-type FET is equal to that of the N-type FET, where the P-type FET and the N-type FET constitute the inverter, this intersection point becomes exactly the midpoint of the power source voltage.

Here, for the sake of simplicity, the term "on-resistance" was used. However, in reality, the characteristic curves of the on-resistance of the P-type FET and N-type FET have non-linearity. In order to explain a little more precisely, a number called a drain current coefficient $\beta$ will be used as an index that represents the ease of flow of the drain current of a FTE.

Drain current coefficient $\beta$; a proportionality constant determined by the size of MOSFET, the aspect ratio, or the like.

If the $\beta$ of the N-type FET and that of the P-type FET are represented by $\beta$n and $\beta$p, respectively, $\beta n=(W/Leff)\cdot(\epsilon ox/Tox)\cdot\mu n$, eff $\beta p=(W/Leff)\cdot(\epsilon ox/Tox)\cdot\mu p$, eff W; gate width, Leff; effective gate length, Tox; thickness of gate oxide film, $\epsilon$ox; permittivity of gate oxide film, $\mu$n, eff; effective mobility of electrons, $\mu$p, eff; effective mobility of positive holes. Using this $\beta$, the drain current of MOSFET can be expressed easily as follows.

$Id=\beta\{(Vgs-Vt)Vds-(\frac{1}{2})(Vds^2)\}(Vds\leq Vgs-ds)$ $Id=(\frac{1}{2})\beta(Vgs-Vt)^2(Vds>Vgs-ds)$ In the case of silicon, the mobility of positive holes is approximately half that of electrons. Therefore, if an N-type FET and a P-type FET are made in the same shape (provided that they have the same threshold voltage), it can be said that The amount of current that flows through the N-type FET is twice as much as the amount of current that flows through the P-type FET.

The on-resistance of the N-type FET is a half of that of the P-type FET. In a standard device, the $\beta$ of the N-type FET is usually set equal to that of the P-type FET or the shape (Width, Height) of the N-type FET is usually set equal to that of the P-type FET.

Figure 1:
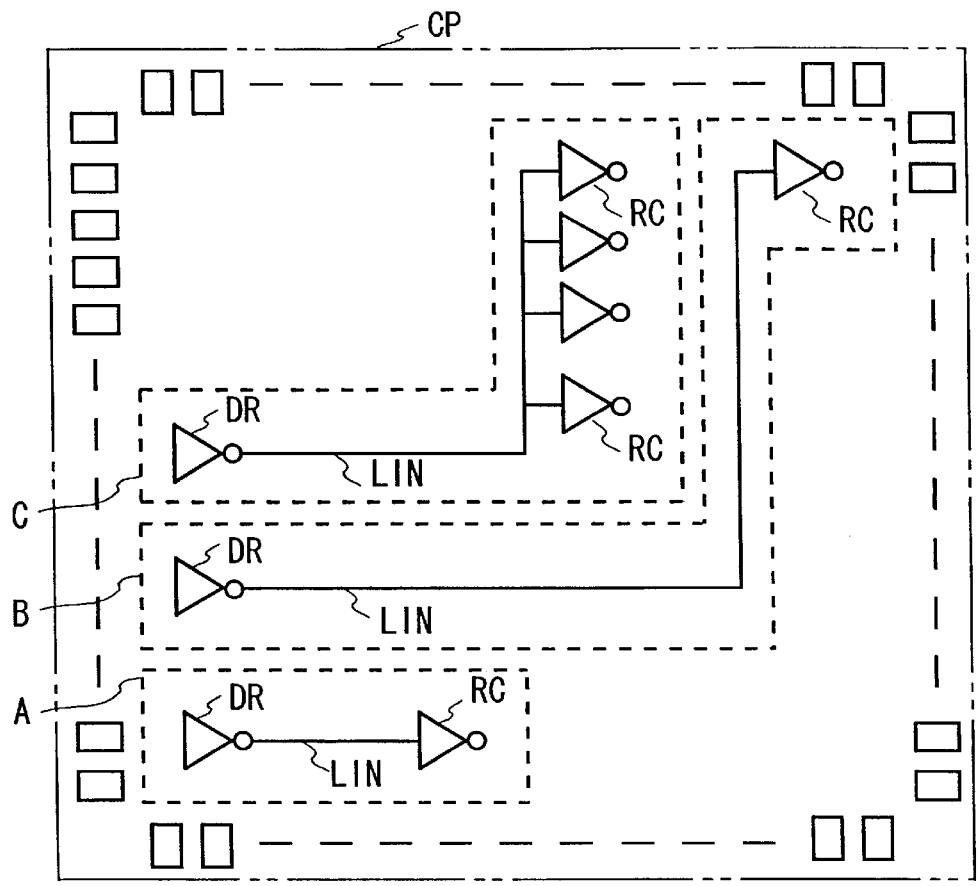
FIG. 1 is a magnified top view of a semiconductor chip for explaining the problems that the conventional technology has.
Figure 2:
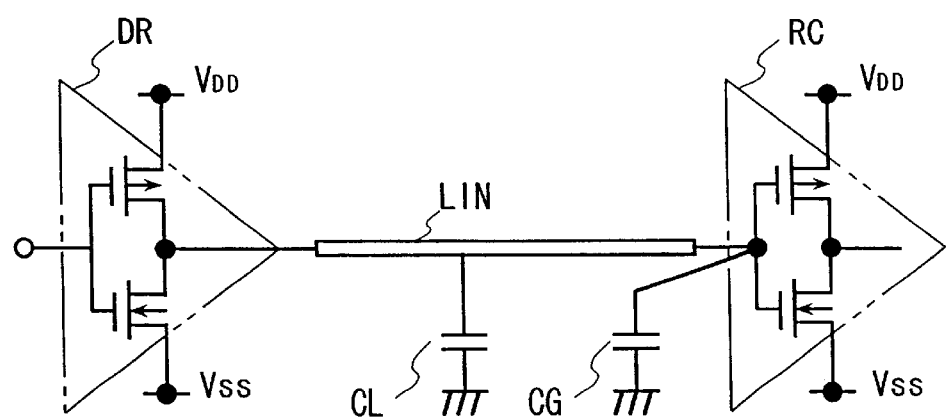
FIG. 2 is a connection diagram for explaining the conventional technology.
Figure 3:
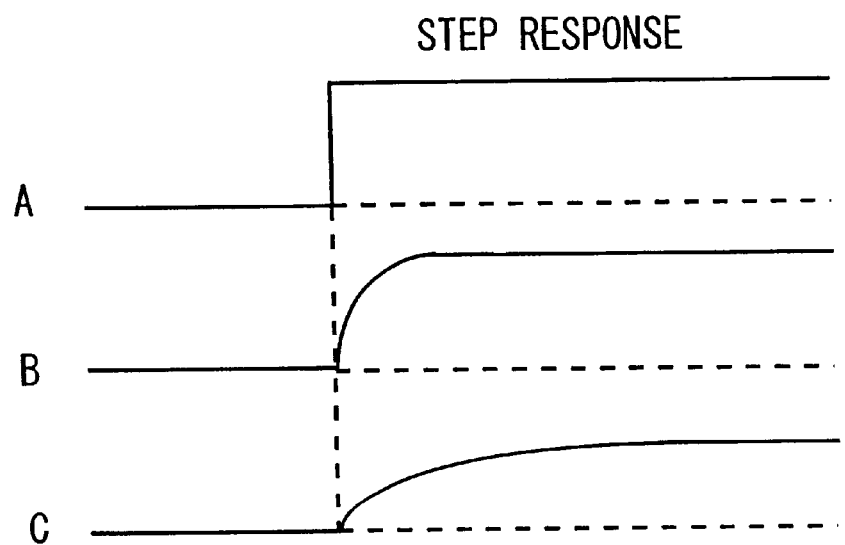
FIG. 3 is a wave-form diagram for explaining an operation state of FIG. 2.
Figure 4:
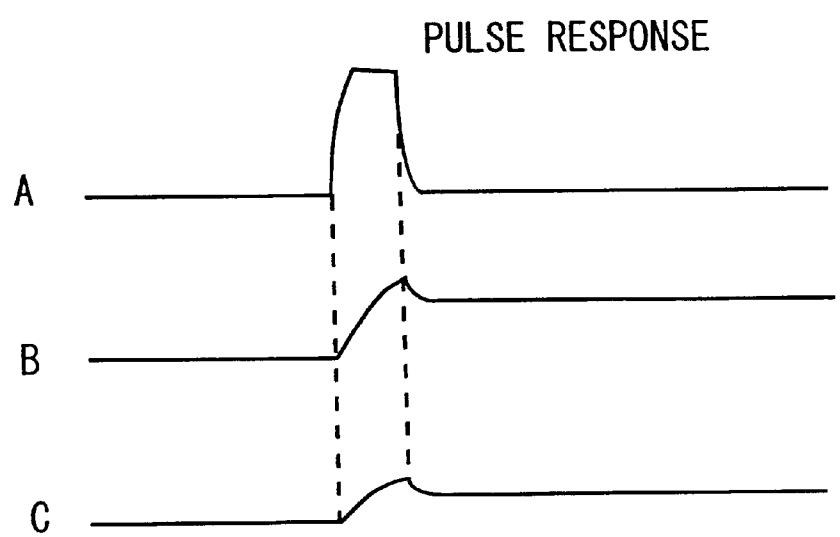
FIG. 4 is a wave-form diagram for explaining another operation state of FIG. 2.
Figure 5:
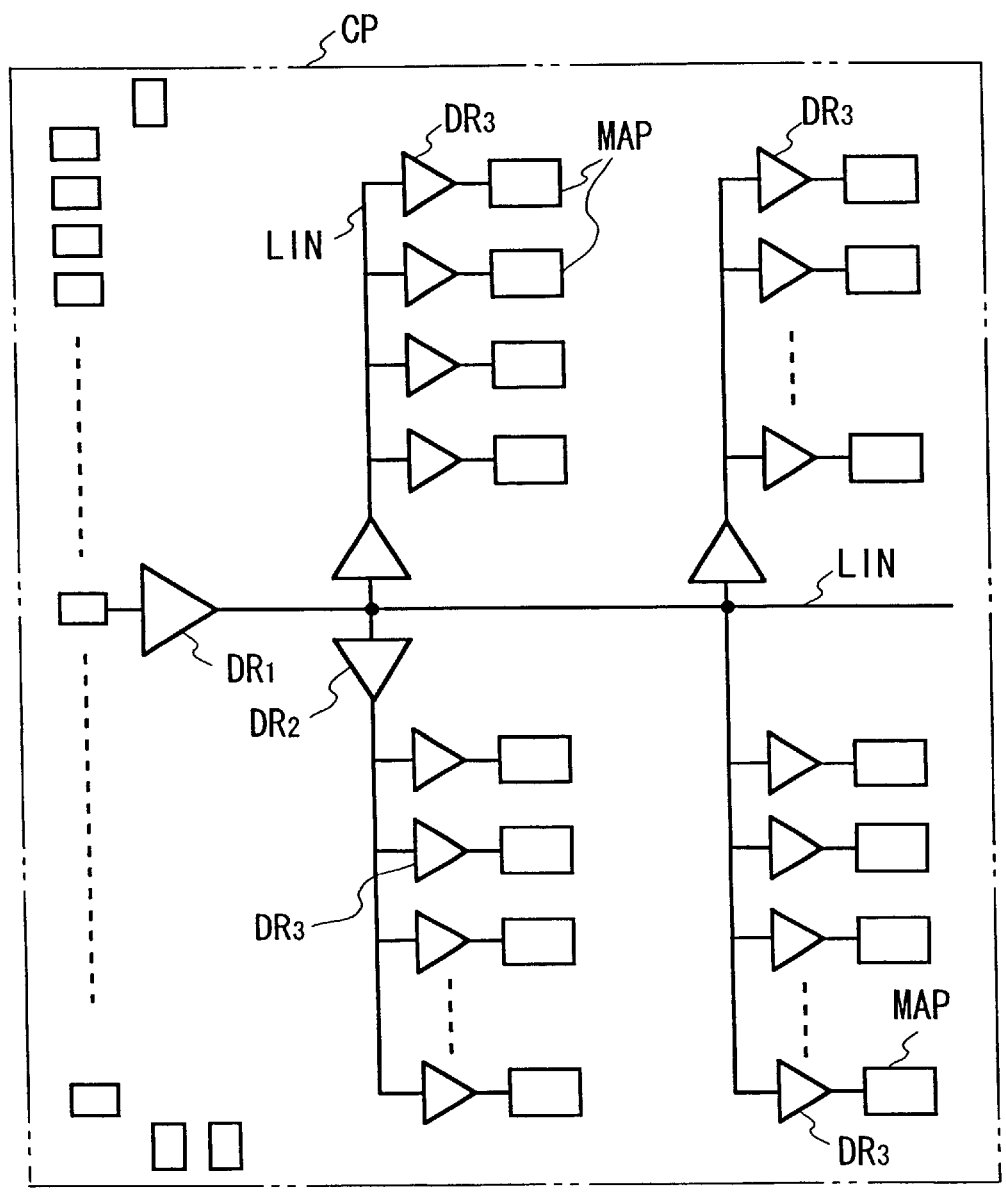
FIG. 5 is a magnified top view of a semiconductor chip for explaining a method for solving the problems that arise in the conventional technology.

In the case in which the ratio of the $\beta$ of the N-type FET with respect to the $\beta$ of the P-type FET ($\beta R=\beta n/\beta p$, beta ratio) is changed by approximately ten times, the resultant changes are indicated approximately by curves Y1 and Y2 shown in FIG. 4. Here, Y1 can be represented by setting $\beta n>\beta p$, ($\beta R=10$), and Y2 can be represented by setting $\beta n<\beta p$, ($\beta R=0.1$), for example ($\beta n$, $\beta p$ are the drain current coefficients of the N-type FET and P-type FET, respectively).

In this case, by setting the beta ratio between the N-type FETQ$_N$ and P-type FETQ$_P$ of the inverter IV, which constitutes the driven circuit RC, in the same manner as that of the assist-circuit AC, the threshold voltage, at which the driven circuit RC is inverted, can be set equal to the midpoint voltage of the power source voltage $V_{DD}$-$V_{SS}$. Therefore, by setting the relation between the inverter IV, which constitutes the assist-circuit AC, and the inverter that constitutes the driven circuit RC to the relation described above (in which the same beta ratio is taken), the driven circuit RC centered at its own threshold voltage receives a signal that is sent from the driver circuit DR.

Figure 9:
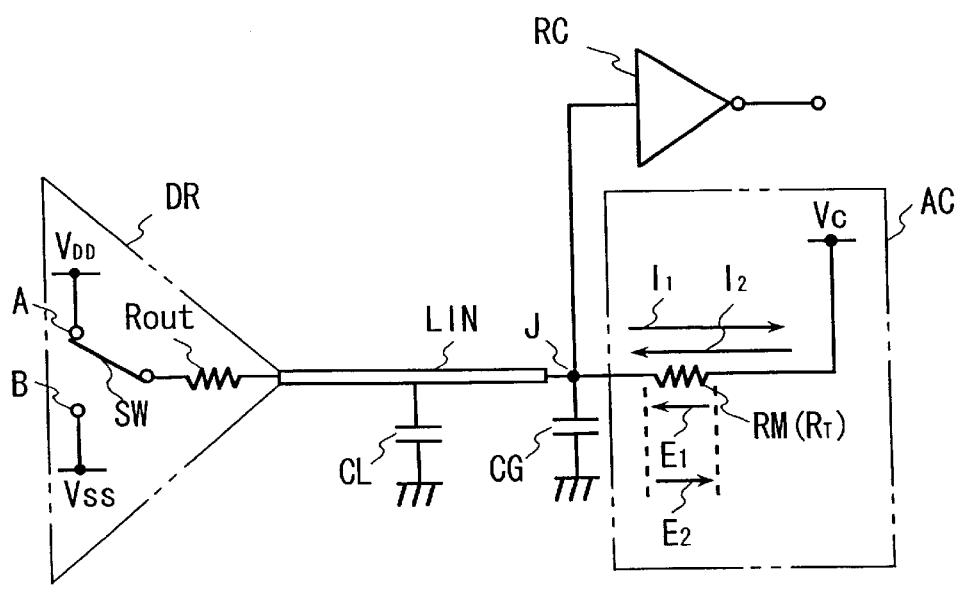
FIG. 9 is an equivalent circuit diagram for explaining the operation of the embodiment shown in FIG. 7.

FIG. 9 shows an equivalent circuit of this signal transmission circuit. The driver circuit DR can be expressed equivalently by a switch SW. $R_{OUT}$ represents the output impedance of the driver circuit DR. In FIG. 9, the direct current resistor of the signal line LIN is omitted. RM represents an equivalent resistor that is equivalent to the output impedance of the assist-circuit AC. In other words, the assist-circuit AC can be represented as a circuit that is connected to the midpoint voltage $V_c$ via the equivalent resistor whose resistance value is $R_T$.

Figure 10:
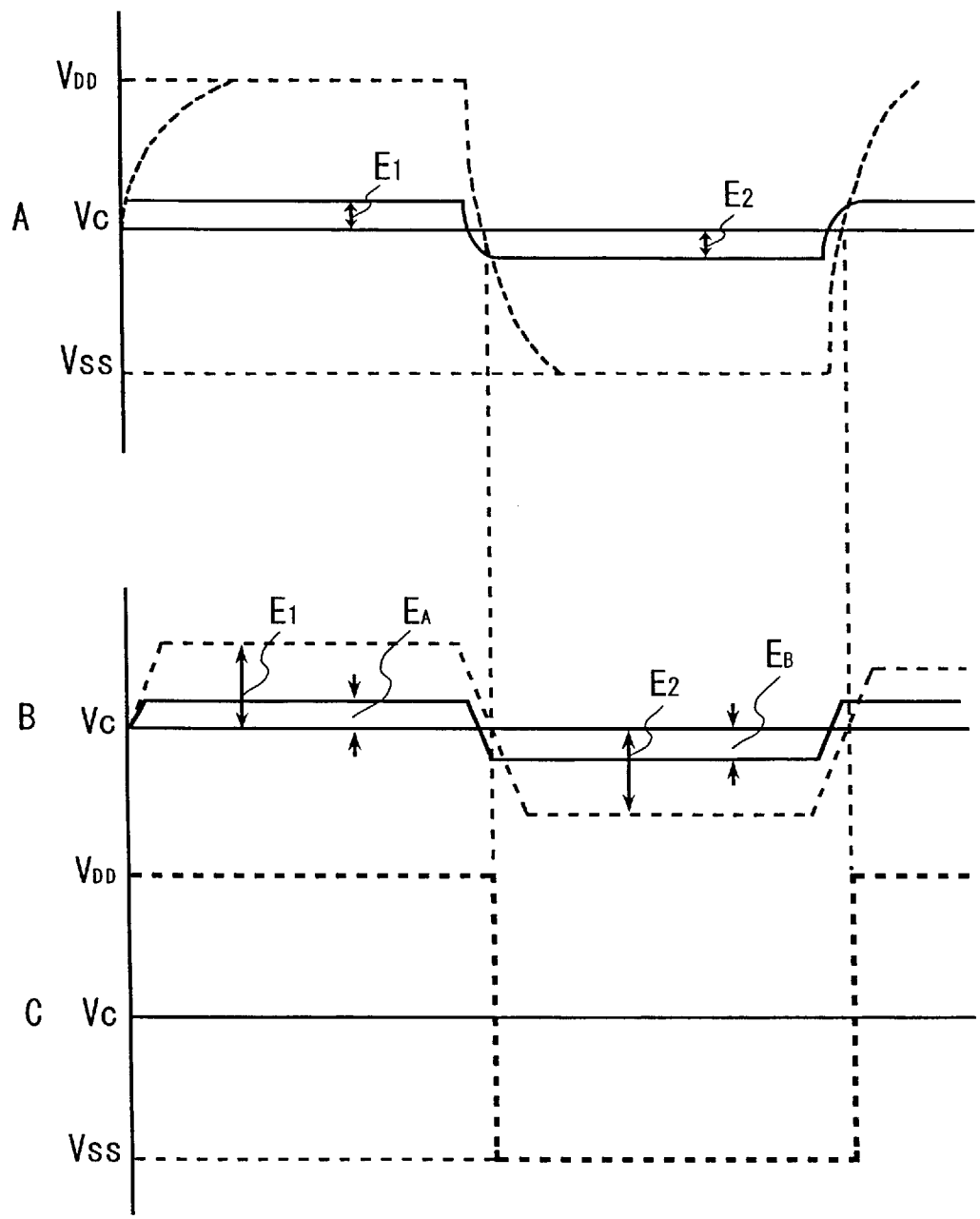
FIG. 10 shows the wave-form of each part of the equivalent circuit shown in FIG. 9.

When the switch SW is switched to the contact point A side in the driver circuit DR, the positive voltage $V_{DD}$ is applied to the signal line LIN through the output impedance $R_{OUT}$. In this case, a current $I_1$ flows through the impedance $R_T$ of the equivalent resistor RM. At the same time, a voltage $E_1$ (FIGS. 10A and 10B) that is skewed toward the positive side with respect to the midpoint voltage $V_c$ is generated at the node J. This voltage $E_1$ can be expressed by $$E_1=(V_{DD}-V_{SS})R_T/(R_T+R_{OUT}) \tag{1}$$

On the other hand, in the driver circuit DR, if the switch SW is switched to the contact point B side, the power source voltage $V_{SS}$ is supplied to the signal line LIN. Hence, in this case, a current $I_2$ flows through the impedance of the assist-circuit AC, and the voltage at the node J shifts to the negative side by $E_2$ with respect to the midpoint voltage $V_c$. This voltage $E_2$ can be expressed by $$E_2=(V_{SS}-V_c)R_T/(R_T+R_{OUT}) \tag{2}$$

As has been mentioned before, the resistance value $R_T$ of the equivalent resistor RM of the assist-circuit AC is small, satisfying the relation $R_T<<R_{OUT}$. Therefore, the amplitudes $E_1$ and $E_2$ of the signals generated at the node J turn out to be micro values. In addition, since the threshold value of the inversion operation of the driven circuit RC is the midpoint voltage $V_c$ when the driven circuit RC operates, the driven circuit RC is assuredly inverted by voltages $E_A$ and $E_B$ (FIG. 10B) that lie within the amplitude ranges of the voltages $E_1$ and $E_2$, respectively, generated at the node J. Therefore, the driven circuit RC is inverted immediately after the voltage at the node J crosses the midpoint voltage $V_c$. Even if the value of the sum of the wiring capacitance CL and input capacitance CG is large and the voltage change of the signal line LIN has a delay, the output of the driven circuit RC can be transmitted in a wave-form that has virtually no wave-form deformation as shown in FIG. 10C.

The relation between the output impedance $R_T$ and output impedance $R_{OUT}$ will now be explained. As the above-given equations show, the voltages $E_1$ and $E_2$ are functions of $R_T$ and $R_{OUT}$. It should be noted that the voltages $E_1$ and $E_2$ tend to zero as $R_T$ tends to zero. However, since the driven circuit RC has a threshold voltage, the value of $R_T$ must be determined within the signal sensitivity of the driven circuit RC. The maximum input voltage at which the driven circuit RC is able to output a stable value of L or H when the input is L is denoted by $V_{thL}$. The minimum input voltage at which the driven circuit RC is able to output a stable value of L or H when the input is H is denoted by $V_{thH}$. As an alternative, when the input is increased gradually from L, the input voltage at which the output voltage of the driven circuit RC starts to change substantially may be denoted by $V_{thL}$. In this case, when the input is decreased gradually from H, the input voltage at which the output voltage of the driven circuit RC starts to change substantially is denoted by $V_{thH}$. For example, when the input voltages $V_{thH}$ and $V_{thL}$ of the driven circuit RC are approximately $V_C+(V_{DD}-V_C) \times 0.2$, and $V_C+(V_{SS}-V_C) \times 0.2$, respectively, it is desirable that the ratio $R_T/R_{OUT}$ be between ¼ and ½, in accordance with equations (1) and (2).

It should be noted that the term "midpoint voltage" used in the present specification does not necessarily mean the exact midpoint voltage between the power source voltages $V_{SS}$ and $V_{DD}$. As has been explained with reference to FIG. 8, the midpoint voltage means any intermediate voltage between the power source voltages $V_{SS}$ and $V_{DD}$, which changes in accordance with the beta ratio.

Figure 11:
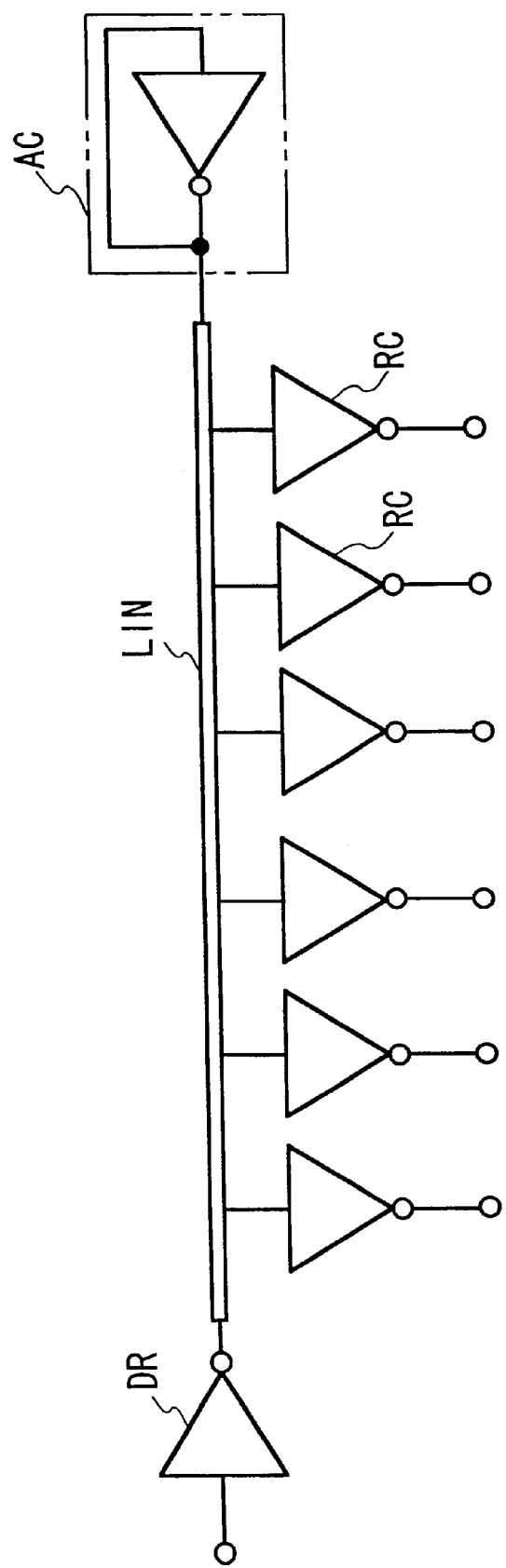
FIG. 11 is a block diagram for explaining a utility example of this invention.

Therefore, as shown in FIG. 11, even if many driven circuits RC are connected to a line LIN, by connecting an assist-circuit AC to this signal line LIN, each of the driven circuits RC operates in accordance with the change in the output voltage of the driver circuit DR. As a result, for example, a simultaneous clock pulse (with no time lag) can be supplied to each of the driven circuits RC.

Figure 12:
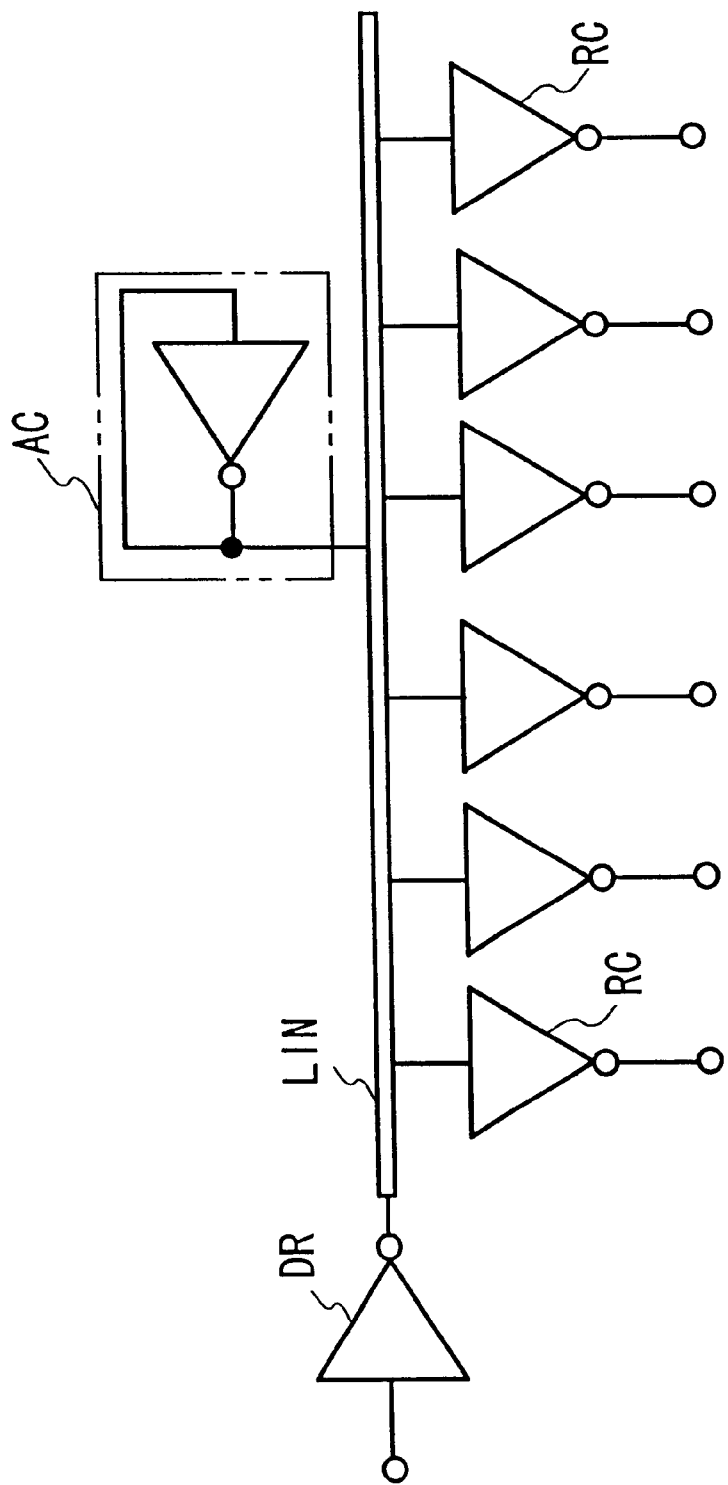
FIG. 12 is a block diagram for explaining another utility example of this invention.

FIG. 12 shows a variation embodiment of the embodiment shown in FIG. 11. This embodiment shows that a normal operation is achieved no matter to what position on a signal line LIN an assist-circuit AC is connected.

Figure 13:
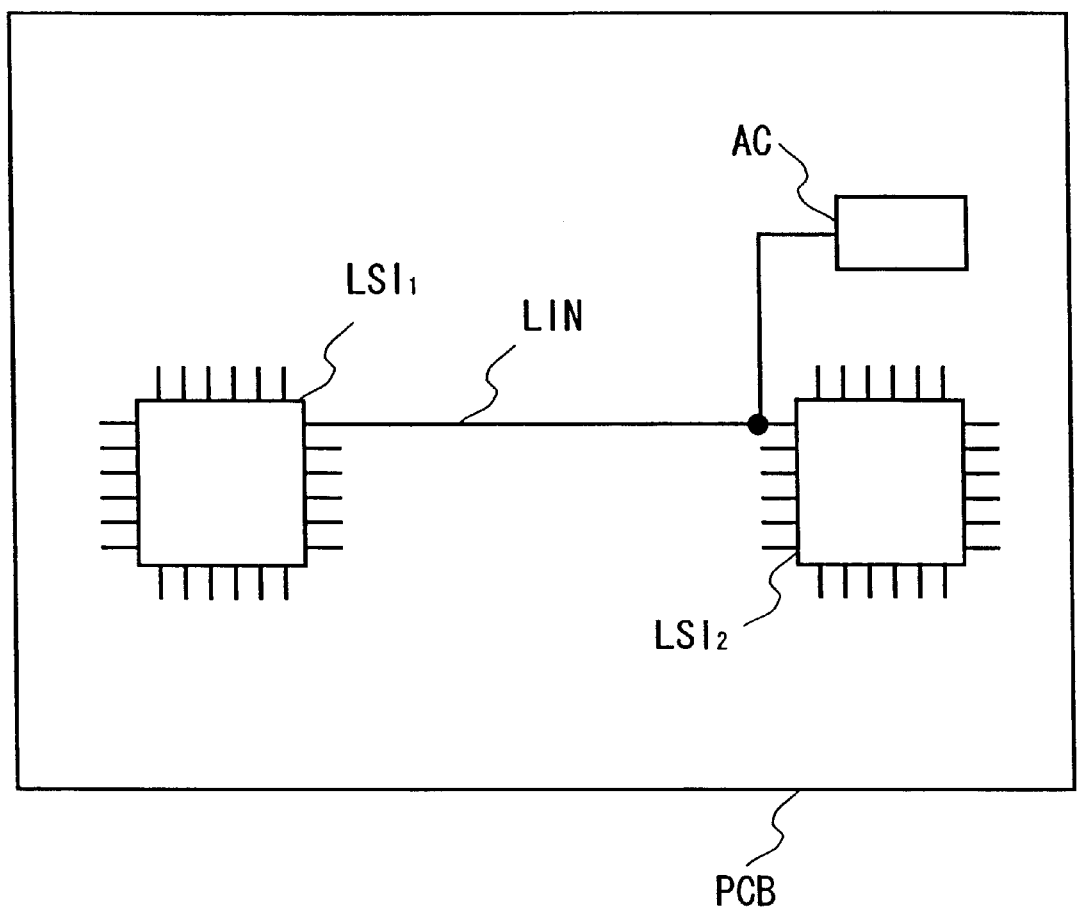
FIG. 13 is a block diagram for explaining further another utility example of this invention.

All the signal lines LIN explained above are formed inside the same semiconductor chip. In order to apply the present invention to a signal line LIN that is formed outside an integrated circuit, as shown in FIG. 13, for example in the case of a signal line LIN that is connected between integrated circuit devices $LSI_1$ and $LSI_2$, the assist-circuit AC must be connected to the termination side of the signal line LIN. In other words, a distributed constant circuit like, for example a micro strip line, is generally used for a signal line LIN formed outside of an integrated circuit device in order to match the characteristic impedance of the signal line LIN with a prescribed impedance. A portion of a distributed constant circuit has inductance and capacitance. Consequently, it is desirable to connect the assist-circuit AC to the termination of the signal line LIN as shown in FIG. 13.

FIG. 13 shows a printed circuit board PCB according to an embodiment of the present invention. This printed circuit board PCB has an $LSI_1$, an $LSI_2$, and the pattern of a signal line LIN. An assist-circuit AC is connected to this signal line LIN. The $LSI_1$ has a driver circuit for sending out a transmission signal. The $LSI_2$ has a driven circuit for receiving a transmission signal. As has been explained before, the assist-circuit AC is connected to the termination of the signal line LIN. As in the cases of the previously described embodiments, this assist-circuit AC outputs a prescribed voltage that is larger than the power source voltage $V_{SS}$ and smaller than the power source voltage $V_{DD}$. Moreover, the assist-circuit AC has output impedance that is lower than that of the driver circuit of the $LSI_1$.

Figure 14:
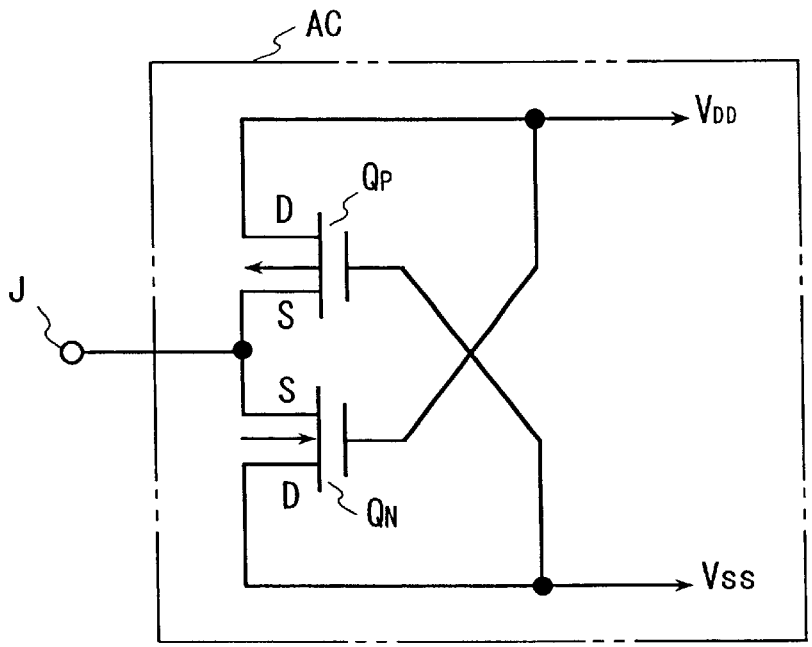
FIG. 14 is a connection diagram for explaining a variation example of an assist-circuit used in this invention.
Figure 15:
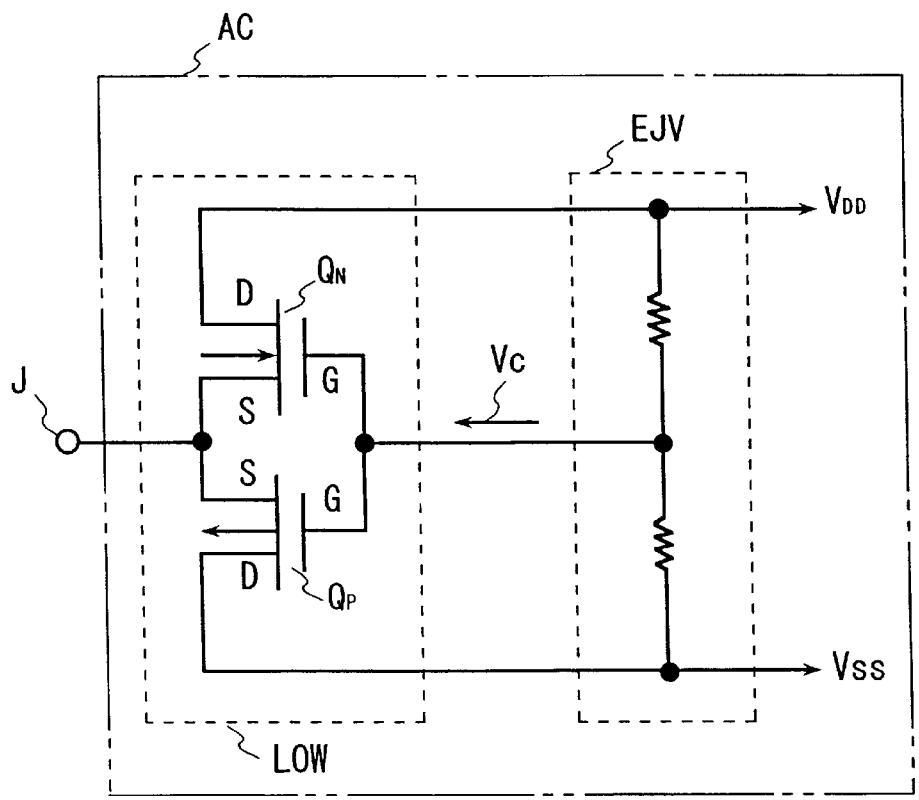
FIG. 15 is a connection diagram for explaining another variation example of the assist-circuit used in this invention.

FIGS. 14 and 15 show variation embodiments of the assist-circuit AC. The assist-circuit AC shown in FIG. 14 is configured to apply a forward bias voltage directly to the gates of the P-type FET $Q_P$ and N-type FET $Q_N$, respectively. By this configuration, the P-type FET $Q_P$ and N-type FET $Q_N$ are constantly kept turned on, the voltage at the node J is held at the midpoint voltage between the voltages $V_{DD}$ and $V_{SS}$. As a result, the assist-circuit AC operates as a midpoint voltage source having low impedance.

FIG. 15 shows an assist-circuit AC that has been constructed combining a low impedance buffer circuit LOW and a midpoint voltage source EJV. The configuration of the low impedance buffer circuit LOW is the exact opposite of that of an inverter. That is, the drain of the N-type FET $Q_N$ is connected to the positive voltage side $V_{DD}$, the drain of the P-type FET $Q_P$ is connected to the negative voltage side $V_{SS}$, the source of the P-type FET $Q_P$ is connected to the source of the N-type FET $Q_N$, the gate of the P-type FET $Q_P$ is connected to the gate of the N-type FET $Q_N$, and the midpoint voltage $V_C$ is supplied from the midpoint voltage source EJV to the common node of the two gates.

Figure 16:
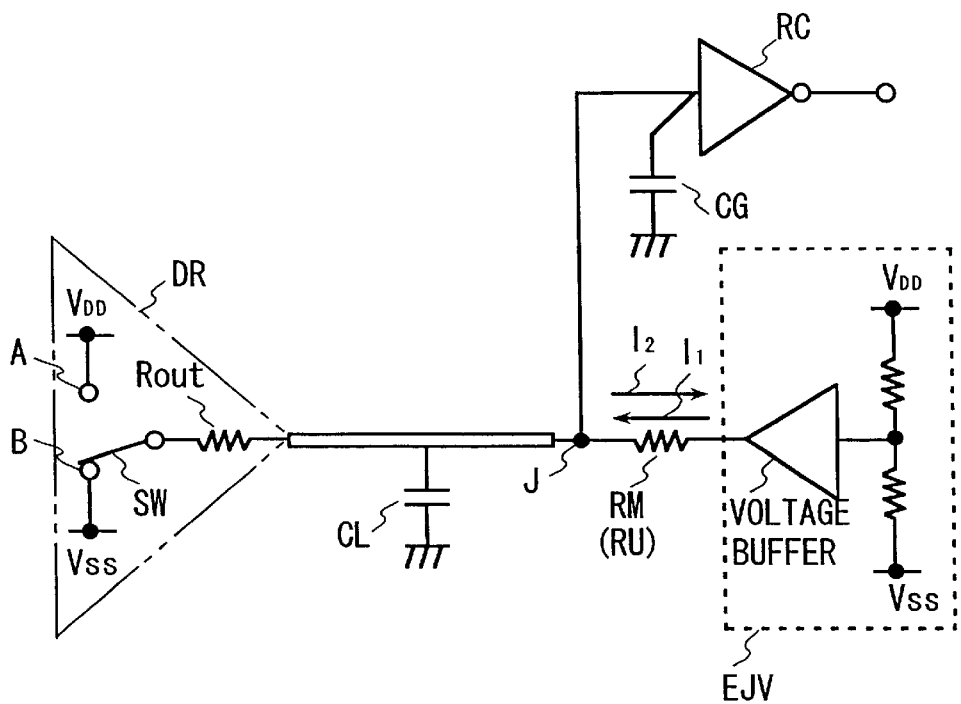
FIG. 16 is an equivalent circuit diagram of FIG. 15.

FIG. 16 shows an equivalent circuit of the low impedance buffer circuit LOW shown in FIG. 15. The P-type FET $Q_P$ and N-type FET $Q_N$, which constitute the low impedance buffer circuit LOW shown in FIG. 15, can be regarded as voltage buffers of gain 1. In the same manner as what is shown in FIG. 9, the P-type FET $Q_P$ and N-type FET $Q_N$ can be represented by an equivalent resistor RM having the same resistance value $R_v$ that is equal to the output impedance and the midpoint voltage source EJV, respectively.

Therefore, in a state in which the driver circuit DR is outputting an L-logic, a current $I_1$ flows from the equivalent resistor RM toward the signal line LIN. As a result, the voltage at the node J is shifted from the midpoint voltage by a small amount in the direction of the negative voltage $V_{SS}$ (L-logic). Therefore, in this case, the driven circuit RC outputs an H-logic.

On the other hand, when the driver circuit DR is inverted to a state in which the driver circuit DR outputs an H-logic, a current $I_2$ flows from the signal line LIN to the equivalent resistor RM toward the midpoint voltage source EJV. When this current $I_2$ flows, the voltage at the node J is shifted from the midpoint voltage $V_c$ slightly toward the positive voltage $V_{DD}$. Therefore, in this state, the driven circuit RC is inverted to a state in which the driven circuit RC outputs an L-logic.

The resistance value $R_v$ of the equivalent resistor RM becomes larger than the resistance value $R_T$ of the equivalent resistor shown in FIG. 9. However, the relation $R_{OUT} >> R_v$ is maintained. As a result, the voltage change at the node J can be suppressed to a slight change in the amplitude. Therefore, in the same way as has been explained with reference to FIGS. 9 and 10, the time interval between the moment at which the output state of the driver circuit DR is inverted and the time at which the threshold value of the driven circuit RC is crossed can be shortened (since the amount of change in the voltage is small). As a result, the embodiment shown in FIG. 15 can also increase the response speed of the driven circuit RC.

Figure 17:
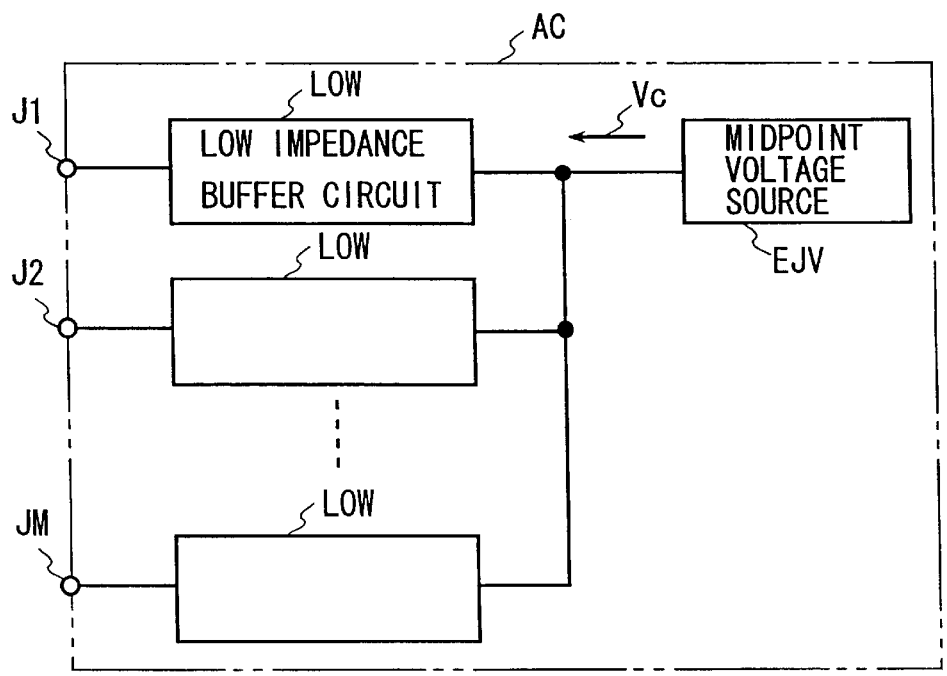
FIG. 17 is a block diagram for explaining a utility example of the embodiment shown in FIG. 15.
Figure 18:
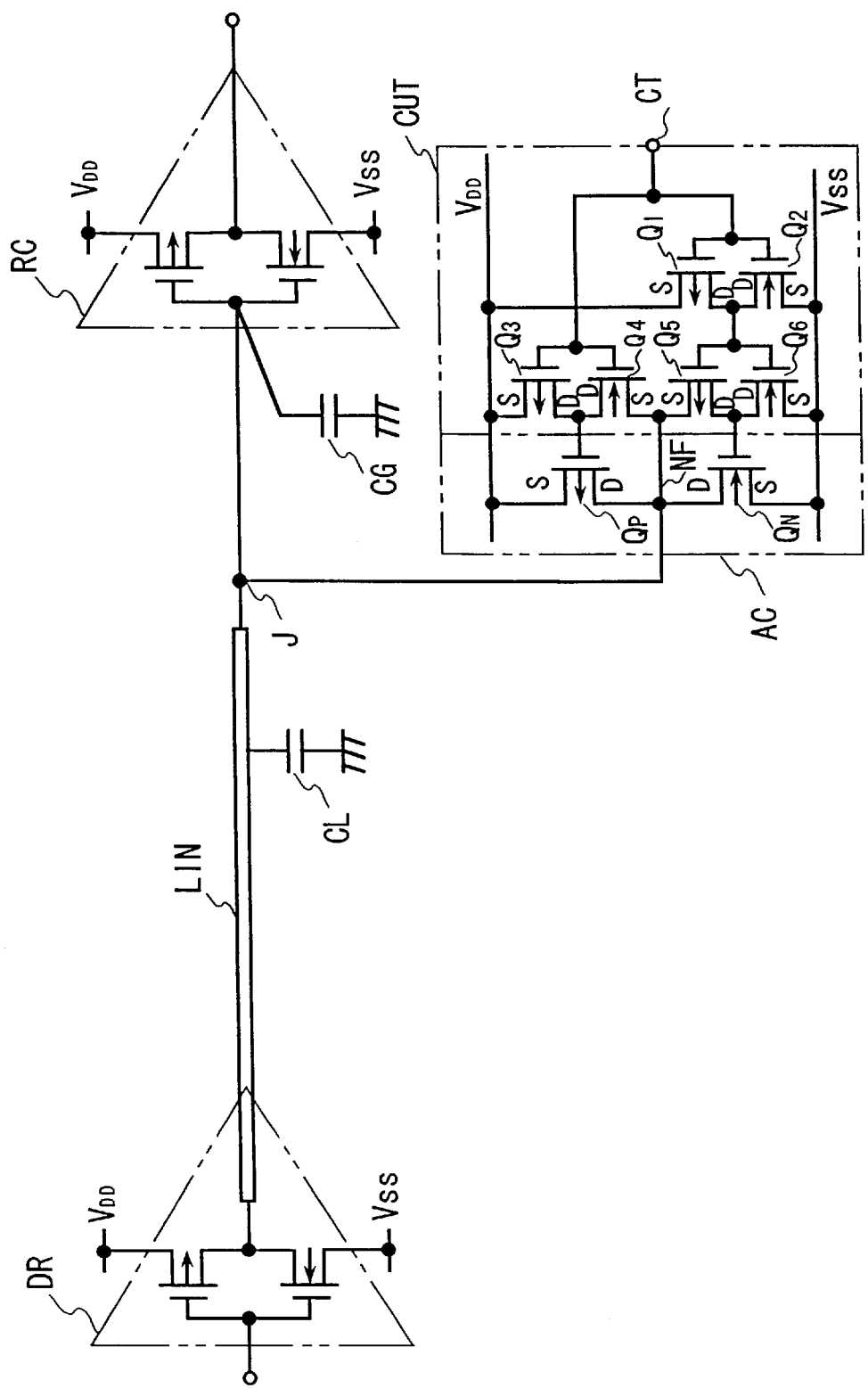
FIG. 18 is a connection diagram for explaining an example in which a cutoff means is attached to an assist-circuit used in this invention.
Figure 19:
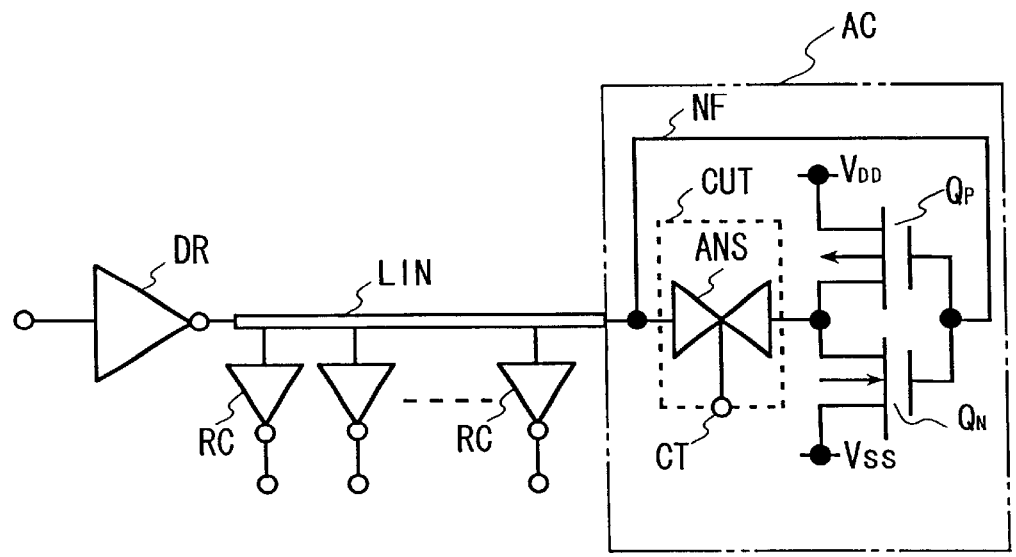
FIG. 19 is a connection diagram for explaining another example of the cutoff means shown in FIG. 18.

In the embodiment shown in FIG. 15, the midpoint voltage source EJV is constructed using a resistance division circuit. However, the assist-circuit AC shown in FIG. 7 or the assist-circuit AC shown in FIG. 14 can also be used for this midpoint voltage source EJV. In the case in which the assist-circuit AC is constructed using a midpoint voltage source EJV and a low impedance buffer circuit LOW, the assist-circuit AC may be connected to multiple signal lines by having a single midpoint voltage source EJV supply the midpoint voltage $V_c$ to multiple low impedance buffer circuits LOW as shown in FIG. 17.

When an active device of a semiconductor integrated circuit having a CMOS structure is held in a stationary state, the consumed current converges to a value that is very close to zero. Therefore, when the semiconductor integrated circuit device is tested, a standard testing procedure includes an item in which this stationary state current is measured and it is tested whether the value of the current is below a prescribed value or not. On the other hand, if the above-described assist-circuit AC is embedded in the semiconductor integrated circuit device, the assist-circuit AC consumes a current even in a stationary state. As a result, it becomes impossible to measure the stationary current of the integrated circuit device in which the assist-circuit AC is embedded.

In the embodiments shown in FIGS. 18 through 21, in order to solve this problem, a cutoff means CUT is added to the assist-circuit AC. A control signal is then given to this cutoff means CUT so as to cut off a current that flows through the assist-circuit AC as needed. In this way, the stationary current can be measured. In the embodiment shown in FIG. 18, a cutoff means CUT is attached to the assist-circuit AC shown in FIG. 7. The cutoff means CUT has a control terminal CT. In this embodiment, the assist-circuit AC is kept active by giving an H-logic to this control terminal CT. When an L-logic is given to the control terminal CT, the assist-circuit AC is switched to an inactive mode in which the assist-circuit AC does not consume any amount of current at all.

In other words, when an H-logic is given to the control terminal CT, FET $Q_1$ and FET $Q_3$ are turned off, and FET $Q_2$ and FET $Q_4$ are turned on. When FET $Q_2$ is turned on and FET $Q_1$ is turned off, FET $Q_5$ is turned on, and FET $Q_6$ is turned off.

As a result, FET $Q_4$ and FET $Q_5$ are turned on. Through these FET $Q_4$ and FET $Q_5$, the gates of FET $Q_P$ and FET $Q_N$ are held connected to each other, and operate as the assist-circuit AC.

When an L-logic is given to the control terminal CT, FET $Q_1$ and FET $Q_3$ are turned on, and FET $Q_2$ and FET $Q_4$ are turned off. Since FET $Q_2$ is turned off and FET $Q_1$ is turned on, FET $Q_5$ is turned off, and FET $Q_6$ is turned on. In other words, since FET $Q_4$ and FET $Q_5$ are turned off and FET $Q_3$ and FET $Q_6$ are turned on, FET $Q_P$ and FET $Q_N$ are turned off. Here, FET $Q_1$, FET $Q_3$, and FET $Q_5$ are turned on. However, since FET $Q_2$, FET $Q_4$, and FET $Q_6$, which are serially connected to FET $Q_1$, FET $Q_3$, and FET $Q_5$, are turned off, the power source current does not flow through the assist-circuit AC at all. Therefore, the stationary current can be measured in a state in which an L-logic is given to the control terminal CT.

In the embodiment shown in FIG. 14, the cutoff means CUT is composed of a switch device ANS that is generally called an analog switch or the like. When the switch device ANS is turned off, FET $Q_P$ and FET $Q_N$, which are components of the assist-circuit AC, are turned off.

Figure 20:
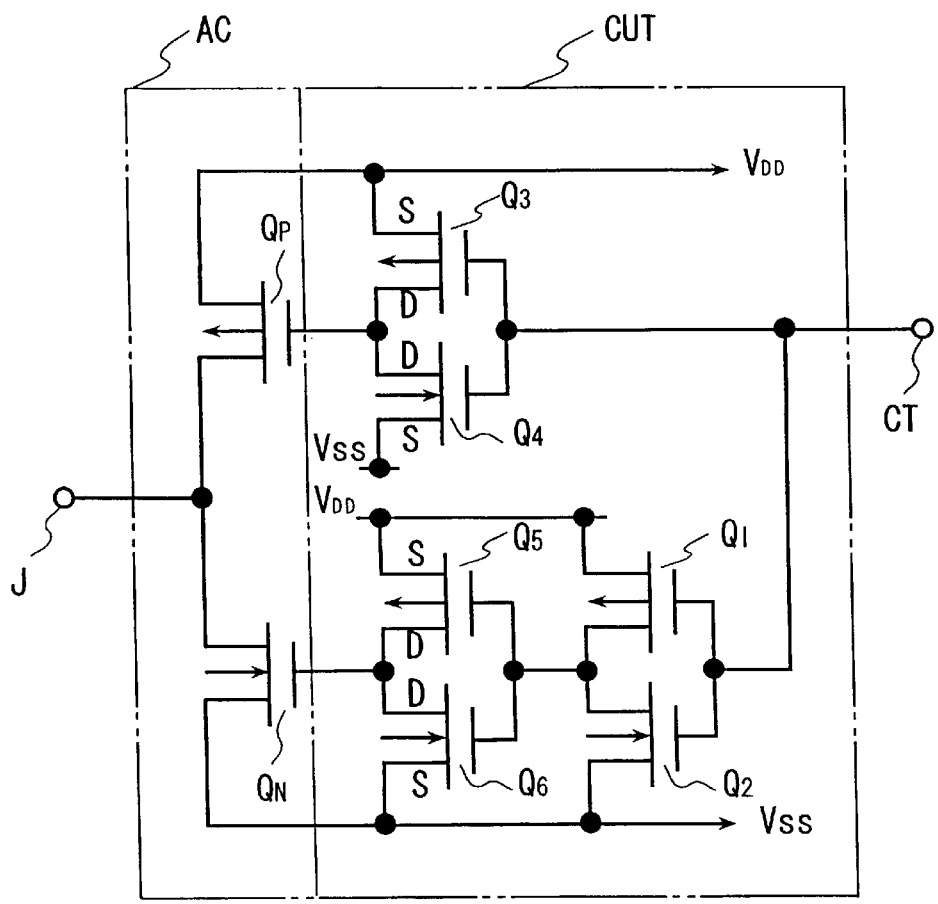
FIG. 20 is a connection diagram for explaining a configuration in which a cutoff means is attached to the assist-circuit shown in FIG. 14.

FIG. 20 shows a case in which a cutoff means CUT is attached to the assist-circuit AC shown in FIG. 14. This case differs from the case shown in FIG. 18 in that the source electrodes of the FET $Q_4$ are connected to the negative power source $V_{SS}$ and the source electrodes of the FET $Q_5$ are connected to the positive power source $V_{DD}$. When these FET $Q_4$ and FET $Q_5$ are turned on by supplying an H-logic to the control terminal CT, forward bias voltages $V_{SS}$ and $V_{DD}$ are applied to the gates of the P-type FET $Q_P$ and N-type FET $Q_N$, respectively. As a result, the P-type FET $Q_P$ and N-type FET $Q_N$ are turned on, and operate as the assist-circuit AC.

When an L-logic is given to the control terminal CT, FET $Q_3$ and FET $Q_6$ are turned on, and FET $Q_4$ and FET $Q_5$ are turned off. In this state, the P-type FET $Q_P$ and N-type FET $Q_N$ are turned off. As a result, the amount of current consumption is held to almost zero.

Figure 21:
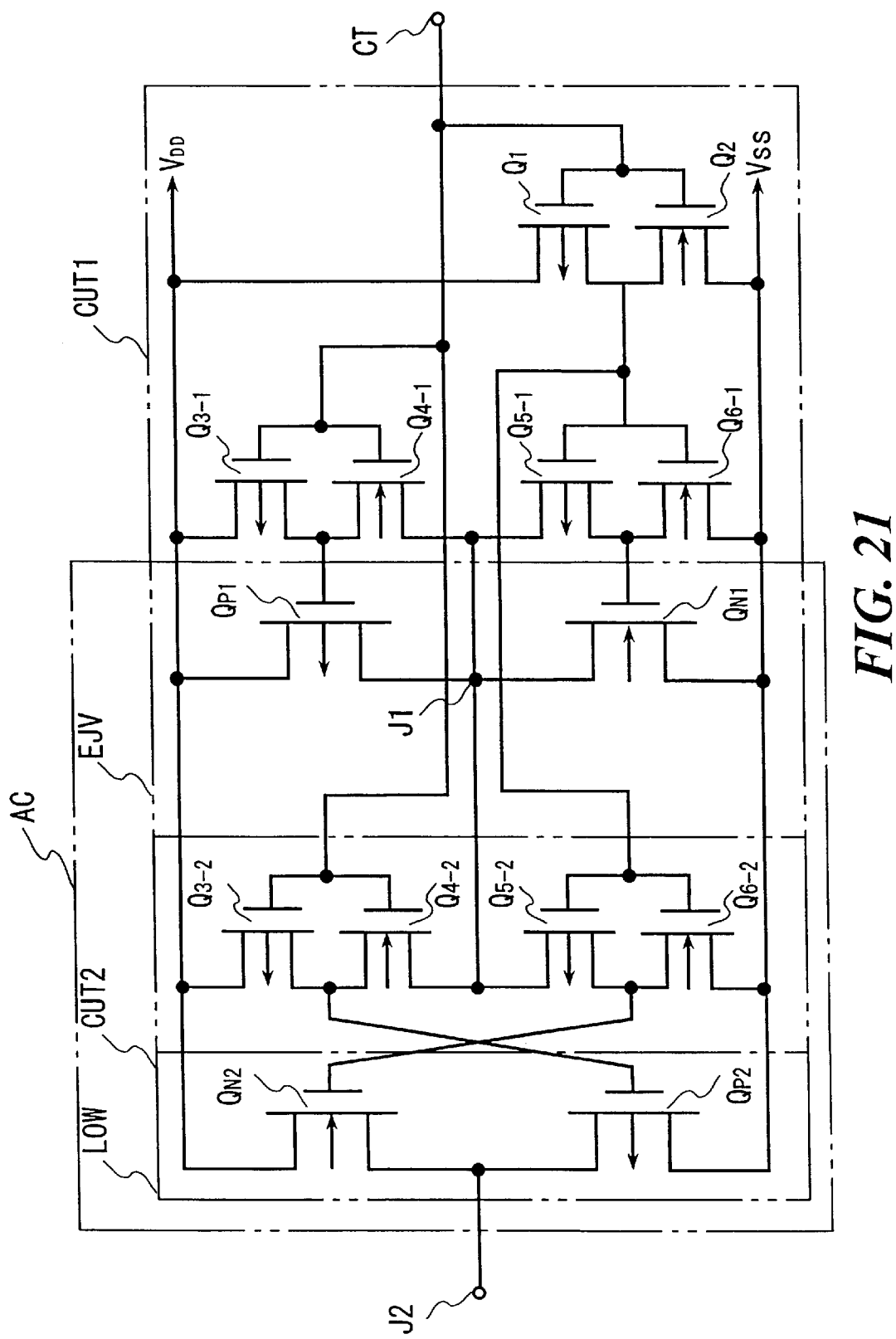
FIG. 21 is a connection diagram for explaining a configuration in which a cutoff means is attached to the assist-circuit shown in FIG. 15 and the assist-circuit shown in FIG. 7 that is used as a midpoint voltage source.

FIG. 21 shows a configuration in which a cutoff means is attached to the assist-circuit AC shown in FIG. 15 in which a low impedance buffer circuit LOW and a midpoint voltage source EJV are installed in combination. Moreover, this embodiment shows a case in which the assist-circuit AC shown in FIG. 7 is used as the midpoint voltage source EJV. Here, CUT1 refers to a cutoff means for controlling a P-type FET $Q_{P1}$ and an N-type FET $Q_{N1}$, which constitute the midpoint voltage source EJV, to a cut-off state. CUT2 refers to a cutoff means for controlling a P-type FET $Q_{P2}$ and an N-type FET $Q_{N2}$, which constitute the low impedance buffer circuit LOW, to a cut-off state.

When an H-logic is given to the control terminal CT, FET $Q_{4-1}$ and FET $Q_{5-1}$ of the cutoff means CUT1 are turned on, the gates of the P-type FET $Q_{P1}$ and N-type FET $Q_{N1}$, which constitute the midpoint voltage source EJV, are connected to each other through these FET $Q_{4-1}$ and FET $Q_{5-1}$. As a result, a circuit identical to the circuit shown in FIG. 7 is constructed, which outputs a midpoint voltage to the node J1.

On the other hand, when an H-logic is given to the input terminal CT, FET $Q_{4-2}$ and FET $Q_{5-2}$ of the cutoff means CUT2 are turned on. As a result, the gates of N-type FET $Q_{N2}$ and P-type FET $Q_{P2}$, which constitute the low impedance buffer circuit LOW, are connected to a common node via FET $Q_{4-2}$ and FET $Q_{5-2}$. A midpoint voltage is then supplied to this common node from the midpoint voltage source EJV. Therefore, in this state, the N-type FET $Q_2$ and P-type FET $Q_{P2}$ have the same circuit structure as the low impedance buffer circuit LOW shown in FIG. 15. When a signal voltage is supplied to the node J2 from the driver circuit DR, the N-type FET $Q_2$ and P-type FET $Q_{P2}$ operate in the same manner as the manner that has been explained with reference to FIG. 15.

When an L-logic is given to the input terminal CT, in the cutoff means CUT1, FET $Q_{3-1}$ and FET $Q_{6-1}$ are turned on, and FET $Q_{4-1}$ and FET $Q_{5-1}$ are turned off. As a result, the N-type FET $Q_{N1}$ and P-type FET $Q_{P1}$, which constitute the midpoint voltage source EJV, are turned off.

In the cutoff means CUT2, FET $Q_{4-2}$ and FET $Q_{5-2}$ are turned off, and FET $Q_{3-2}$ and FET $Q_{6-2}$ are turned on. As a result, the N-type FET $Q_{N2}$ and P-type FET $Q_{P2}$, which constitute the low impedance buffer circuit LOW, are turned off.

Therefore, when an L-logic is given to the control terminal CT, all the currents that flow through the assist-circuit AC shown in FIG. 21 are also cut off, making it possible to measure the stationary current.

In the above-explained embodiments, the assist-circuit is constructed by connecting an inverter in with a total feedback circuit NF. In what follows, other embodiments will be explained in which an assist-circuit is formed using circuits other than an inverter IV, for example, a NAND gate and a NOR gate.

Figure 22:
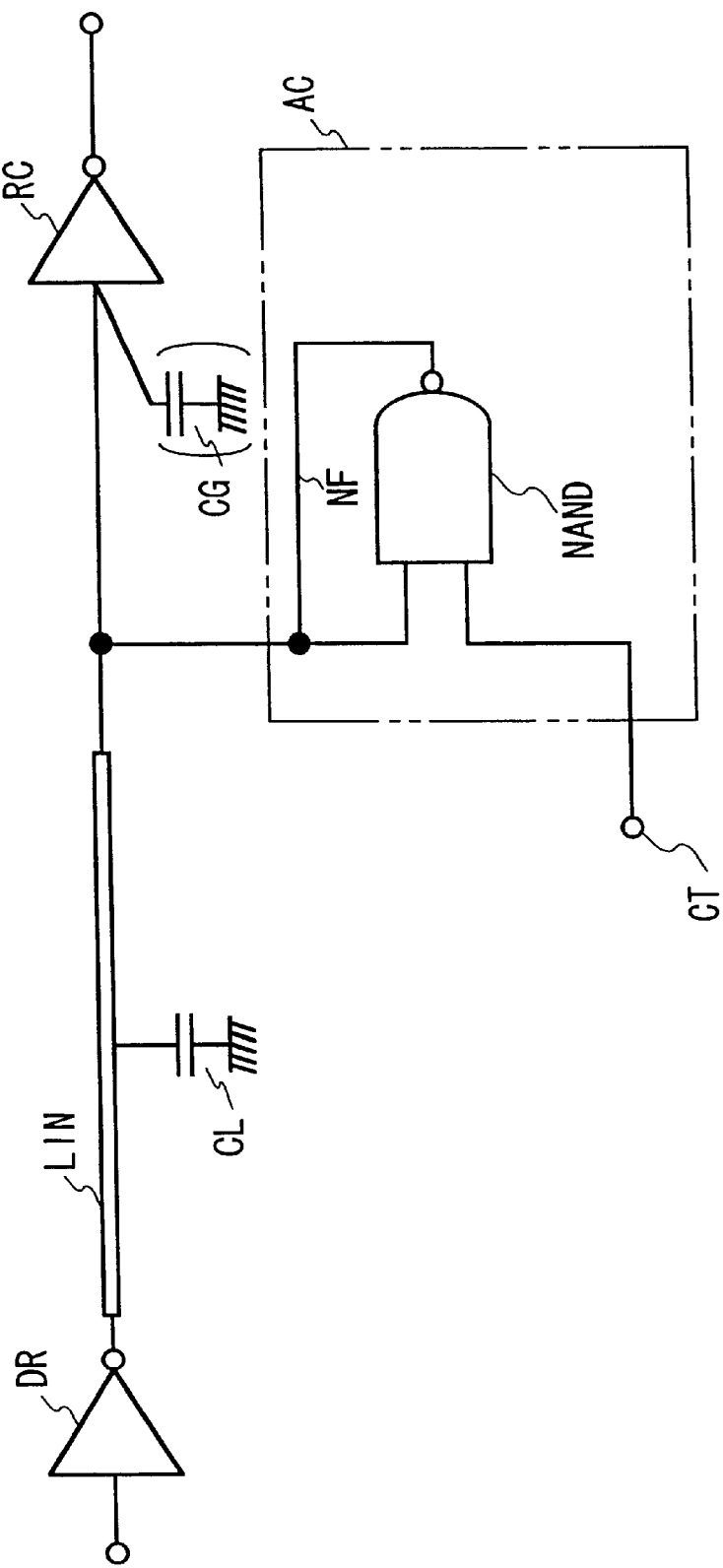
FIG. 22 is a block diagram showing another embodiment of a signal transmission circuit according to the present invention.

FIG. 22 shows another embodiment of a signal transmission circuit according to the present embodiment. In comparison with the embodiment shown in FIG. 6 in which the assist-circuit has an inverter IN, the assist-circuit according to the present embodiment has a NAND gate. The assist-circuit shown in FIG. 22 is constructed by connecting a total feedback circuit NF with a NAND gate. Since the NAND gate has multiple input terminals, one of the input terminals can be used as a control terminal CT as shown in the drawing.

Figure 23:
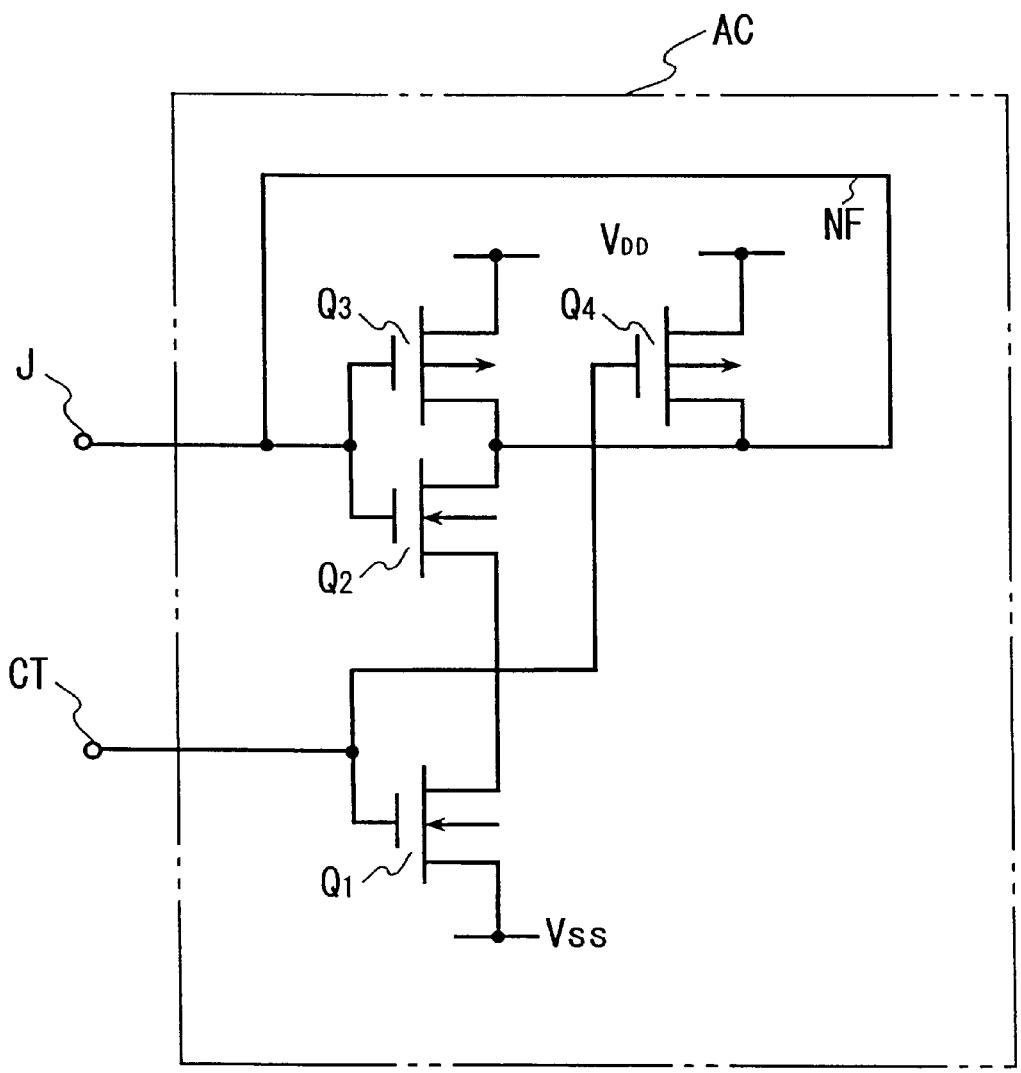
FIG. 23 shows a specific configuration of an assist-circuit in which a NAND gate is used.

FIG. 23 shows a specific example of an assist-circuit in which a NAND gate is used. According to this circuit configuration, the assist-circuit can be turned on or off by switching an input signal, which is supplied to the control terminal CT, between H-logic and L-logic. In this embodiment, if H-logic is given to the control terminal CT, the assist-circuit is held in the operation mode and is able to output a midpoint voltage. If L-logic is given to the control terminal CT, the assist-circuit is held in the non-operation mode and outputs H.

If H-logic is given to the control terminal CT, FET $Q_1$ is turned on, and FET $Q_4$ is turned off. Therefore, the drain of FET $Q_2$ is held connected with the drain of FET $Q_3$. As a result, the assist-circuit is held in the operation mode and outputs a midpoint voltage. As has been explained before, by setting the beta ratios of N-type FET $Q_N$ and P-type FET $Q_P$, which constitute the driven circuit, equal to the beta ratio of the assist-circuit, the threshold voltage of the driven circuit RC, at which the driven circuit is inverted, can be set equal to the midpoint voltage of the power source voltage $V_{DD}$–$V_{SS}$. As a result, the driven circuit RC is able to receive a signal, which is centered at the threshold voltage of the driven circuit RC, transmitted from the driver circuit DR.

On the other hand, if L-logic is given to the control terminal, FET $Q_1$ is turned off, and FET $Q_4$ is turned on. Therefore, the voltage at the common node J is held at H. In testing a current leak of (stationary current test) of a semiconductor integrated circuit device, the output voltage of the transmission side (driver circuit DR) needs to be set equal to the voltage at the common node J.

In this way, by controlling the input supplied to the control terminal CT, the operation of the assist-circuit, which is constructed using a NAND gate, can be turned on or off.

Figure 24:
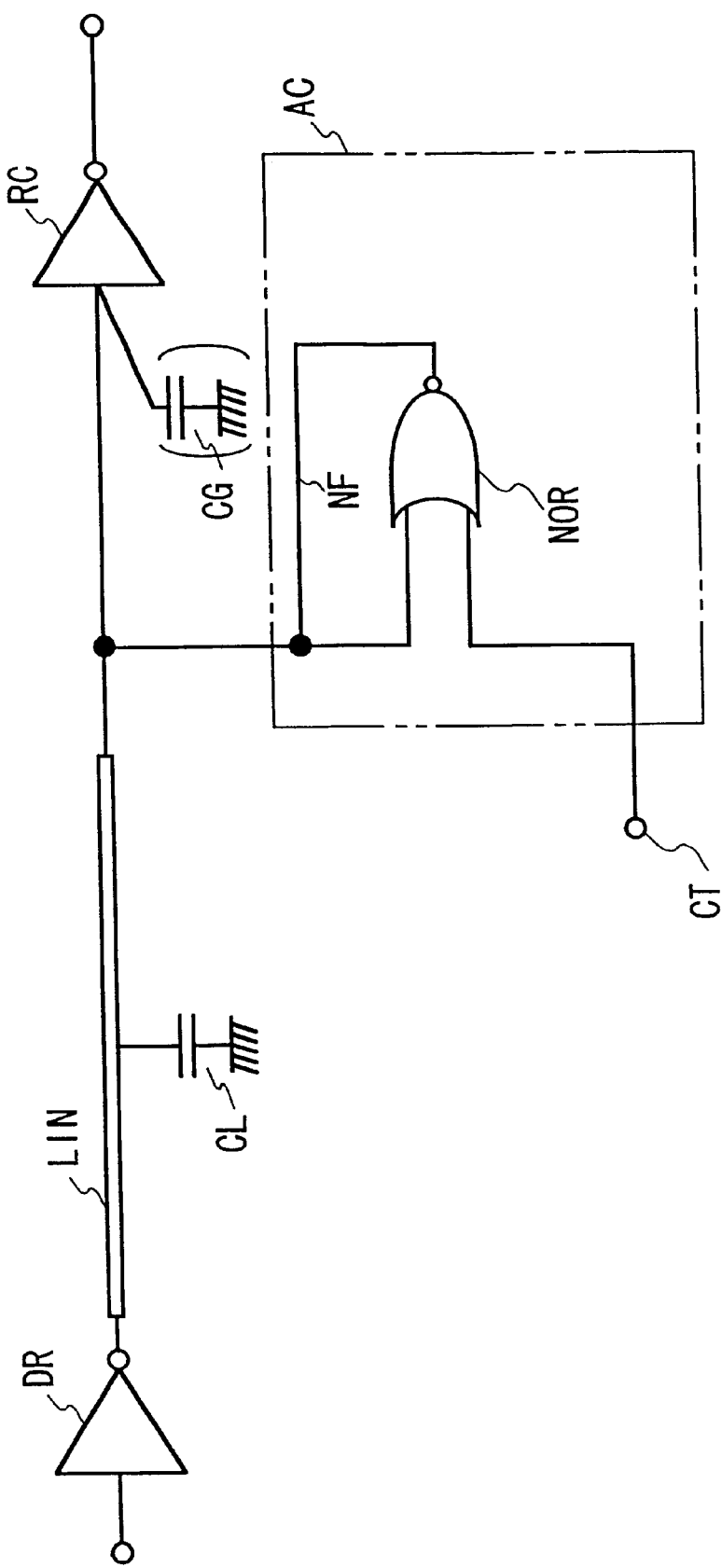
FIG. 24 is a block diagram showing further another embodiment of a signal transmission circuit according to the present invention.

FIG. 24 shows further another embodiment of a signal transmission circuit according to the present invention. In comparison with the embodiment shown in FIG. 6, which has an inverter IN, the assist-circuit according to the present embodiment has a NOR gate. The assist-circuit shown in FIG. 24 is constructed by connecting a total feedback circuit NF with a NOR gate. Since the NOR gate has multiple input terminals, one of the input terminals can be used as a control terminal CT as shown in the drawing.

Figure 25:
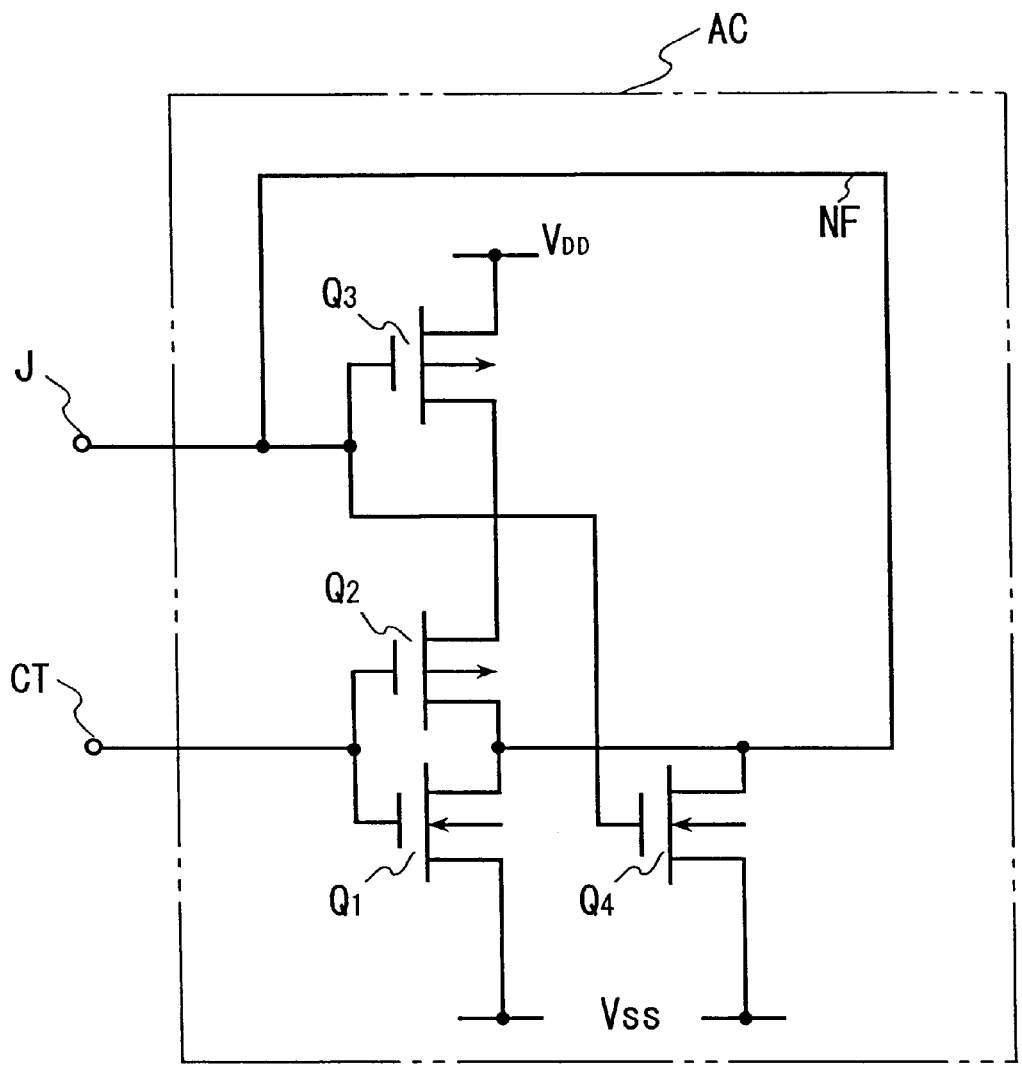
FIG. 25 shows a specific configuration of an assist-circuit in which a NOR gate is used.

FIG. 25 shows a specific example of an assist-circuit in which a NOR gate is used. According to this circuit configuration, the assist-circuit can be turned on or off by switching an input signal, which is supplied to the control terminal CT, between H-logic and L-logic. In this embodiment, if L-logic is given to the control terminal CT, the assist-circuit is held in the operation mode and is able to output a midpoint voltage. If H-logic is given to the control terminal CT, the assist-circuit is held in the non-operation mode and outputs L.

If L-logic is given to the control terminal CT, FET $Q_1$ is turned off, and FET $Q_4$ is turned on. Since the drain of FET $Q_3$ is connected with the source of FET $Q_2$, the drain of FET $Q_3$ is held. connected with the drain of FET $Q_4$. As a result, the assist-circuit is held in the operation mode and outputs a midpoint voltage. As has been explained before, by setting the beta ratios of N-type FET $Q_N$ and P-type FET $Q_P$, which constitute the driven circuit, equal to the beta ratio of the assist-circuit, the threshold voltage of the driven circuit RC, at which the driven circuit is inverted, can be set equal to the midpoint voltage of the power source voltage $V_{DD}$–$V_{SS}$. As a result, the driven circuit RC is able to receive a signal, which is centered at the threshold voltage of the driven circuit RC, transmitted from the driver circuit DR.

On the other hand, if H-logic is given to the control terminal, FET $Q_1$ is turned on, and FET $Q_4$ is turned off. Since FET $Q_1$ is turned on, the voltage at the common node J is held at L. In testing a current leak of (stationary current test) of a semiconductor integrated circuit device, the output voltage of the transmission side (driver circuit DR) needs to be set equal to the voltage at the common node J.

In this way, by controlling the input supplied to the control terminal CT, the operation of the assist-circuit, which is constructed using a NOR gate, can be turned on or off.

It should be noted that the "midpoint voltage source" shown in FIG. 15 does not necessarily output the exact midpoint voltage between the power source voltages $V_{SS}$ and $V_{DD}$, but a voltage that corresponds to the threshold voltage of the driven circuit RC.

As has been explained above, according to the present invention, by connecting an assist-circuit AC to a signal line LIN, the signal line LIN is excited with a small amplitude centered at the midpoint voltage of the power source voltage. In addition, by having a low resistance resistor inserted parallel with a capacitance that slows down the response speed, the transition time is shortened. As a result, the driven circuit RC is inverted when the voltage changes slightly after the signal of the driver circuit DR is inverted. Thus, the driven circuit RC is able to detect with a slight delay the timing at which the signal sent from the driver circuit DR is inverted. In other words, the response time of the driven circuit RC can be accelerated. As a result, even if the driver circuit DR outputs a pulse having a narrow pulse width, it is possible to assuredly detect this pulse and reproduce this pulse on the output side of the driven circuit RC. Moreover, according to this invention, even if the power source voltage changes, the midpoint voltage $V_C$, which the assist-circuit AC outputs, changes in accordance with the change. Therefore, even if the power source voltage changes at this stage, the midpoint voltage $V_C$ follows the threshold value of the driven circuit RC. In this way, a normal operation can be maintained constantly.

Therefore, in a large-scale semiconductor integrated circuit having a large semiconductor chip, for example, even if the total length of a clock supply signal line becomes long, a clock can be assuredly transmitted to the termination side of this clock supply signal line.

In addition, without being restricted to a clock supply line, like a bus line, even if a signal line has a wiring configuration in which many input capacitors are connected to the signal line and a data reception circuit is connected to each place, data can be sent to all the data reception circuits. Therefore, by applying this invention, a large-scale integrate circuit can be realized.

An assist-circuit AC having a total feedback circuit and a beta ratio that is equal to that of a driven circuit is able to generate automatically a voltage that matches the logic threshold voltage of the driven circuit. In particular, in the case in which both a driven circuit RC and the assist-circuit AC are formed on the same device (semiconductor chip), the output voltage of the assist-circuit AC changes in accordance with the logic threshold voltage of the driven circuit RC. Therefore, even if the logic threshold voltage of the driven circuit RC changes, due to, for example, a change in temperature, a signal can be transmitted with a high degree of accuracy. Moreover, in this case, a signal is transmitted inside the device without being influenced by a manufacturing deviation.

In addition, according to this invention, a cutoff termination CUT is attached to circuits such as an assist-circuit AC and a midpoint voltage source, and a configuration has been proposed that is capable of controlling a current, which flows through circuits such as the assist-circuit AC and midpoint voltage source, to a cutoff state by this cutoff means. Therefore, even if the assist-circuit AC and midpoint voltage source are in stationary states or even if the assist-circuit AC and midpoint voltage source consume an idling current, the idling current can be removed by controlling the assist-circuit AC and midpoint voltage source to a cutoff state.

Therefore, in the case in which an integrated circuit device having a built-in assist-circuit AC or midpoint voltage source has been manufactured, or in the case in which the semiconductor integrated circuit device is tested, the stationary current can be easily measured, which is an additional advantage.

Although the present invention has been described using its embodiments, the scope of the present invention is not limited to these embodiments. Those skilled in the art can add various modifications and improvements to the embodiments of the present invention. It is clear from the claims that such modified or improved embodiments can be also covered by the scope of the present invention.

What is claimed is:

1. A signal transmission circuit, comprising:
    a driver circuit configured for transmitting a signal;
    a signal line having one end coupled to the driver circuit and configured for propagating the transmitted signal;
    a driven circuit coupled to the other end of the signal line, the driven circuit being configured so as to be powered by two power source voltages Vss and Vdd (Vdd>Vss) and for receiving the transmitted signal; and
    an assist circuit, coupled to the signal line at a point between the one end and the other end, the assist-circuit being configured for outputting a prescribed voltage to the signal line, the prescribed voltage being larger than power source voltage Vss and being smaller than power source voltage Vdd;
    wherein an output impedance of the assist-circuit is lower than an output impedance of the driver circuit.

* * * * *